(12) United States Patent
Ikeda et al.

(10) Patent No.: US 12,426,425 B2
(45) Date of Patent: Sep. 23, 2025

(54) DISPLAY DEVICE

(71) Applicant: JAPAN DISPLAY INC., Tokyo (JP)

(72) Inventors: Masanobu Ikeda, Tokyo (JP); Yasuhiro Kanaya, Tokyo (JP); Naoki Takada, Tokyo (JP)

(73) Assignee: Japan Display Inc., Tokyo (JP)

( * ) Notice: Subject to any disclaimer, the term of this patent is extended or adjusted under 35 U.S.C. 154(b) by 599 days.

(21) Appl. No.: 17/486,038

(22) Filed: Sep. 27, 2021

(65) Prior Publication Data
US 2022/0013578 A1 Jan. 13, 2022

Related U.S. Application Data

(63) Continuation of application No. PCT/JP2020/013821, filed on Mar. 26, 2020.

(30) Foreign Application Priority Data

Mar. 28, 2019 (JP) .................. 2019-064551

(51) Int. Cl.
*H10H 29/14* (2025.01)
*G06F 3/044* (2006.01)
(Continued)

(52) U.S. Cl.
CPC ............ *H10H 29/142* (2025.01); *G06F 3/044* (2013.01); *H10H 20/8312* (2025.01); *H10H 20/855* (2025.01); *H10H 20/857* (2025.01)

(58) Field of Classification Search
CPC ............. H10H 29/142; H10H 20/8312; H10H 20/855; H10H 20/857; G06F 3/044; G06F 2203/04108; G06F 3/0421; G06F 3/0445; G06F 3/0412; H01L 25/167; H01L 25/0753; G09F 9/30; G09F 9/33; G09G 3/20; G09G 3/32
See application file for complete search history.

(56) References Cited

U.S. PATENT DOCUMENTS

2004/0057873 A1* 3/2004 Yerazunis .............. G01N 21/78
  436/164
2004/0090186 A1   5/2004 Yoshida et al.
(Continued)

FOREIGN PATENT DOCUMENTS

CN    1499471      5/2004
CN    201796564 U  4/2011
(Continued)

OTHER PUBLICATIONS

Chinese Office Action issued Aug. 31, 2023 in corresponding Chinese Application No. 2020800247686.
(Continued)

*Primary Examiner* — Su C Kim
(74) *Attorney, Agent, or Firm* — K&L Gates LLP

(57) ABSTRACT

A display device includes a substrate, a plurality of pixels provided to the substrate, and a plurality of first inorganic light emitting elements and a plurality of second inorganic light emitting elements provided to the pixels. The first inorganic light emitting elements are configured to output first light in a visible light region, and the second inorganic light emitting elements are configured to output second light in an infrared light region.

13 Claims, 12 Drawing Sheets

(51) Int. Cl.
    *H10H 20/831*     (2025.01)
    *H10H 20/855*     (2025.01)
    *H10H 20/857*     (2025.01)

(56) References Cited

U.S. PATENT DOCUMENTS

| | | |
|---|---|---|
| 2008/0211395 A1 | 9/2008 | Koshihara et al. |
| 2010/0214266 A1 | 8/2010 | Koshihara et al. |
| 2011/0141486 A1 | 6/2011 | Wada et al. |
| 2015/0364107 A1 | 12/2015 | Sakariya et al. |
| 2016/0328090 A1* | 11/2016 | Klinghult .............. G06F 3/0416 |
| 2017/0064291 A1* | 3/2017 | Do ........................... G06F 3/147 |
| 2017/0213502 A1 | 7/2017 | Henry et al. |
| 2018/0261655 A1 | 9/2018 | Lee et al. |
| 2018/0299982 A1 | 10/2018 | Liu et al. |
| 2019/0252576 A1* | 8/2019 | Lee .......................... G09G 3/32 |
| 2019/0266379 A1 | 8/2019 | Huang et al. |
| 2019/0340409 A1 | 11/2019 | Zhu et al. |
| 2020/0126477 A1 | 4/2020 | Henry et al. |

FOREIGN PATENT DOCUMENTS

| | | |
|---|---|---|
| CN | 102096464 | 6/2011 |
| CN | 102665308 | 9/2012 |
| CN | 106483658 | 3/2017 |
| CN | 109426774 | 3/2019 |
| CN | 109509767 A | 3/2019 |
| JP | 2017529557 A | 10/2017 |
| JP | 2018-147877 A | 9/2018 |
| JP | 2019139076 A | 8/2019 |
| WO | WO2019/049360 A1 | 3/2019 |

OTHER PUBLICATIONS

Japanese Office Action issued Feb. 28, 2023 in corresponding Japanese Application No. 2019-064551.
Japanese Office Action issued Jan. 10, 2023 in corresponding Japanese Application No. 2019-064551.
International Search Report in Application No. PCT/JP2020/013821, mailed Jun. 9, 2020.
Taiwanese Office Action issued Aug. 23, 2022 in corresponding Taiwanese Application No. 110131710.
Office Action issued in corresponding Japanese Application No. 2023-119612, mailed on Mar. 26, 2024 and English translation of same. 7 pages.

* cited by examiner

DISPLAY DEVICE

CROSS-REFERENCE TO RELATED APPLICATION

This application is a continuation of International Patent Application No. PCT/JP2020/013821 filed on Mar. 26, 2020 which designates the United States, incorporated herein by reference, and which claims the benefit of priority from Japanese Patent Application No. 2019-064551 filed on Mar. 28, 2019, incorporated herein by reference.

BACKGROUND

1. Technical Field

The present disclosure relates to a display device.

2. Description of the Related Art

Displays with micro light emitting diodes (micro LEDs) serving as display elements have recently been attracting attention (refer to Japanese Translation of PCT International Application Publication No. 2017-529557 (JP-T-2017-529557), for example). A plurality of LEDs are coupled to an array substrate (or a driver backplane in JP-T-2017-529557). The array substrate includes a pixel circuit (or an electronic control circuit in JP-T-2017-529557) that drives the LED.

Displays provided with LEDs are expected to include a sensor that detects various kinds of information, including information on proximity of an object to be detected, such as a finger (e.g., hover detection), and biological information for personal identification (e.g., fingerprint detection and vein pattern detection). If light in a visible light region output from the LEDs is used to detect biological information, it may possibly be difficult to detect the biological information depending on the type of the object to be detected.

An object of the present disclosure is to provide a display device that can satisfactorily detect biological information.

SUMMARY

A display device according to an embodiment of the present disclosure includes a substrate, a plurality of pixels provided to the substrate, and a plurality of first inorganic light emitting elements and a plurality of second inorganic light emitting elements provided to the pixels. The first inorganic light emitting elements are configured to output first light in a visible light region, and the second inorganic light emitting elements are configured to output second light in an infrared light region.

DETAILED DESCRIPTION

Figure 1:
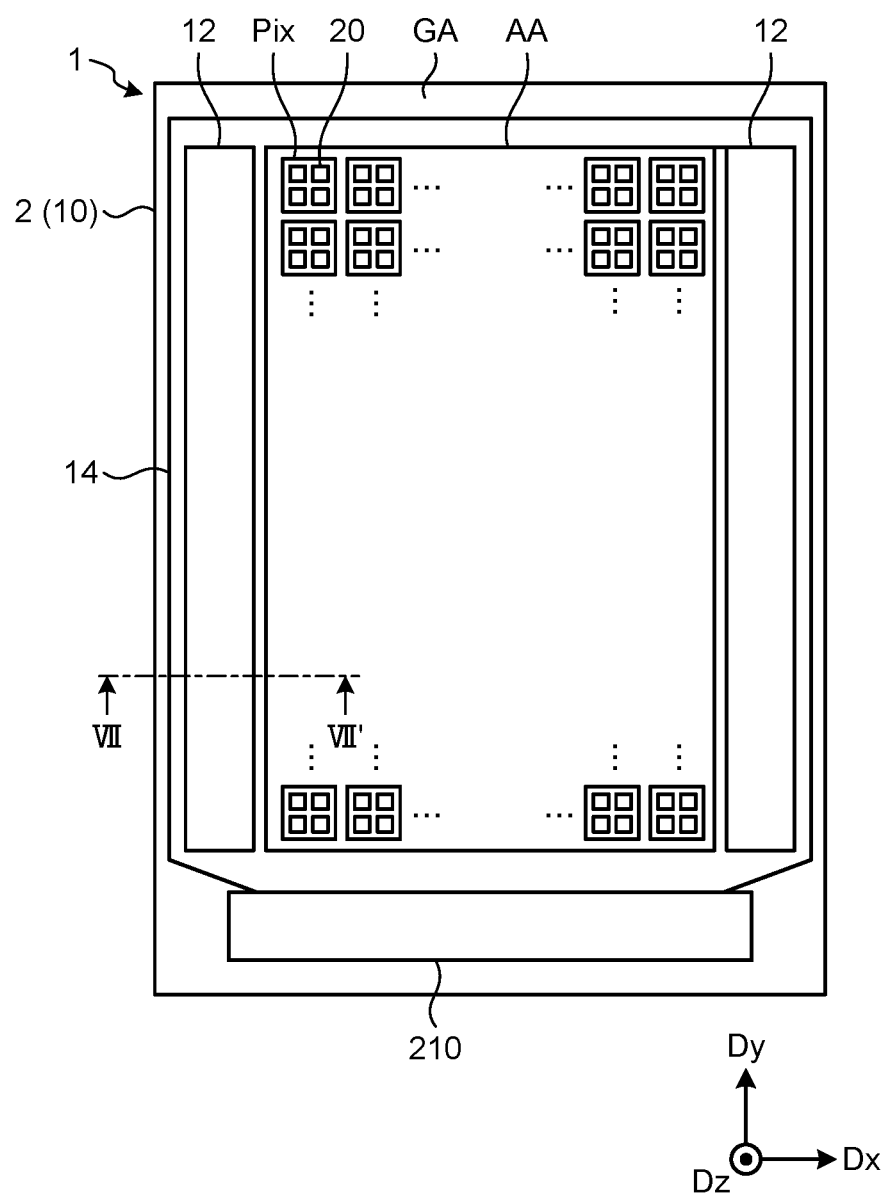
FIG. 1 is a plan view schematically illustrating a display device according to a first embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

First Embodiment

FIG. 1 is a plan view schematically illustrating a display device according to a first embodiment. As illustrated in FIG. 1, a display device 1 includes an array substrate 2, a plurality of pixel groups Pix, drive circuits 12, a drive integrated circuit (IC) 210, and cathode wiring 14. The array substrate 2 is a drive circuit board for driving the pixel groups Pix and is also called a backplane or an active matrix substrate. The array substrate 2 includes a substrate 10, a plurality of transistors, a plurality of capacitances, and various kinds of wiring, for example.

As illustrated in FIG. 1, the display device 1 has a display region AA and a peripheral region GA. The display region AA is disposed overlapping the pixel groups Pix and displays an image. The peripheral region GA does not overlap the pixel groups Pix and is disposed outside the display region AA.

The pixel groups Pix are arrayed in a first direction Dx and a second direction Dy in the display region AA of the substrate 10. In the present specification, the first direction Dx and the second direction Dy are parallel to the surface of the substrate 10. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 10, for example. In the following description, planar view indicates the positional relation when viewed in the third direction Dz.

The drive circuits 12 are provided in the peripheral region GA of the substrate 10. The drive circuits 12 drive a plurality of gate lines (e.g., a light emission control scanning line BG, a reset control scanning line RG, an initialization control scanning line IG, and a writing control scanning line SG (refer to FIG. 4)) based on various control signals received from the drive IC 210. The drive circuits 12 sequentially or simultaneously select a plurality of gate lines and supply gate drive signals to the selected gate lines. As a result, the drive circuits 12 select a plurality of pixel groups Pix coupled to the gate lines.

The drive IC 210 is a circuit that controls display on the display device 1. The drive IC 210 is mounted on the peripheral region GA of the substrate 10 by chip-on-glass (COG) bonding. The mounting form of the drive IC 210 is not limited thereto, and the drive IC 210 may be mounted on a wiring substrate coupled to the peripheral region GA of the substrate 10 by chip-on-film (COF) bonding. The wiring substrate is a flexible printed circuit board or a rigid substrate, for example.

The cathode wiring 14 is provided in the peripheral region GA of the substrate 10. The cathode wiring 14 is provided surrounding the pixel groups Pix in the display region AA and the drive circuits 12 in the peripheral region GA. Cathodes of respective light emitting elements 5 are electrically coupled to the common cathode wiring 14 and are supplied with a fixed potential (e.g., a ground potential). More specifically, a cathode terminal 53 (refer to FIG. 7) of the light emitting element 5 is coupled to the cathode wiring 14 via a cathode electrode 22. The cathode wiring 14 may partially have a slit and be provided as two different wires on the substrate 10.

Figure 2:
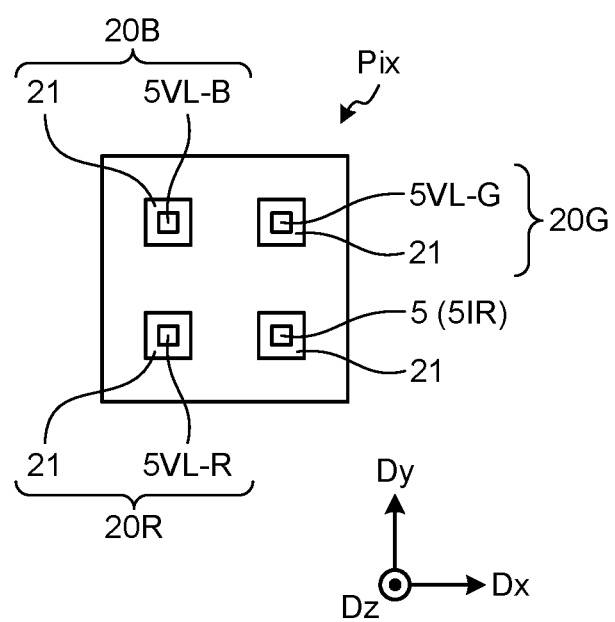
FIG. 2 is a plan view of a pixel group including a plurality of pixels.

FIG. 2 is a plan view of a pixel including a plurality of pixel groups. As illustrated in FIG. 2, one pixel group Pix includes a plurality of pixels 20. The pixel group Pix includes a first pixel 20R, a second pixel 20G, and a third pixel 20B, for example. The first pixel 20R displays a primary color of red as the first color. The second pixel 20G displays a primary color of green as the second color. The third pixel 20B displays a primary color of blue as the third color. In the following description, the first pixel 20R, the second pixel 20G, and the third pixel 20B are referred to as the pixels 20 when they need not be distinguished from one another.

The pixels 20 each include a first light emitting element 5VL and an anode electrode 21. One pixel group Pix includes a second light emitting element 5IR. The first light emitting element 5VL outputs first light in a visible light region. The wavelength range of the first light is approximately 380 nm to 780 nm, for example. The second light emitting element 5IR outputs second light in an infrared light region. The wavelength range of the second light is approximately 800 nm to 950 nm, for example. In the following description, the first light emitting element 5VL and the second light emitting element 5IR are simply referred to as the light emitting elements 5 when they need not be distinguished from each other. The first pixel 20R, the second pixel 20G, and the third pixel 20B are provided with a first light emitting element 5VL-R, a first light emitting element 5VL-G, and a first light emitting element 5VL-B, respectively. In the following description, the first light emitting element 5VL-R, the first light emitting element 5VL-G, and the first light emitting element 5VL-B are simply referred to as the first light emitting elements 5VL when they need not be distinguished from one another.

The display device 1 displays an image by outputting different light (e.g., red, green, and blue light) from the first light emitting elements 5VL-R, 5VL-G, and 5VL-B in the first pixel 20R, the second pixel 20G, and the third pixel 20B, respectively. The display device 1 can detect biological information on an object to be detected, such as a finger Fin and a palm, based on the second light output from the second light emitting element 5IR. Examples of the biological information include, but are not limited to, fingerprint, blood vessel image (vein pattern) of the finger Fin and the palm, pulse wave, pulse, blood oxygen concentration, etc.

The light emitting elements 5 are provided to each of the pixel groups Pix. The light emitting element 5 is an inorganic light emitting diode (LED) chip having a size of several micrometers to 300 micrometers in planar view. Typically, an element having a chip size of 100 micrometers or larger is called a mini LED, and an element having a size of several micrometers to smaller than 100 micrometers is called a micro LED. The display device 1 according to the present disclosure may include LEDs in any size, and various types of LEDs may be properly used depending on the screen size (size of one pixel) of the display device 1. The display device 1 including the micro LEDs in the respective pixels is also called a micro LED display device. The term "micro" of the micro LED is not intended to limit the size of the light emitting element 5.

As illustrated in FIG. 2, the first pixel 20R and the second light emitting element 5IR are disposed side by side in the first direction Dx in one pixel group Pix. The first pixel 20R and the third pixel 20B are disposed side by side in the second direction Dy. The second pixel 20G and the second light emitting element 5IR are disposed side by side in the second direction Dy. The first color, the second color, and the third color are not limited to red, green, and blue, respectively, and may be any desired colors, such as complementary colors. The first light emitting elements 5VL may output light in four or more colors. The positions of the pixels 20 and the second light emitting element 5IR are not limited to those illustrated in FIG. 2. The second light emitting element 5IR, for example, may be disposed side by side with the second pixel 20G or the third pixel 20B in the first direction Dx. Alternatively, the first pixel 20R, the second pixel 20G, the third pixel 20B, and the second light emitting element 5IR may be repeatedly arrayed in this order in the first direction Dx.

Figure 3:
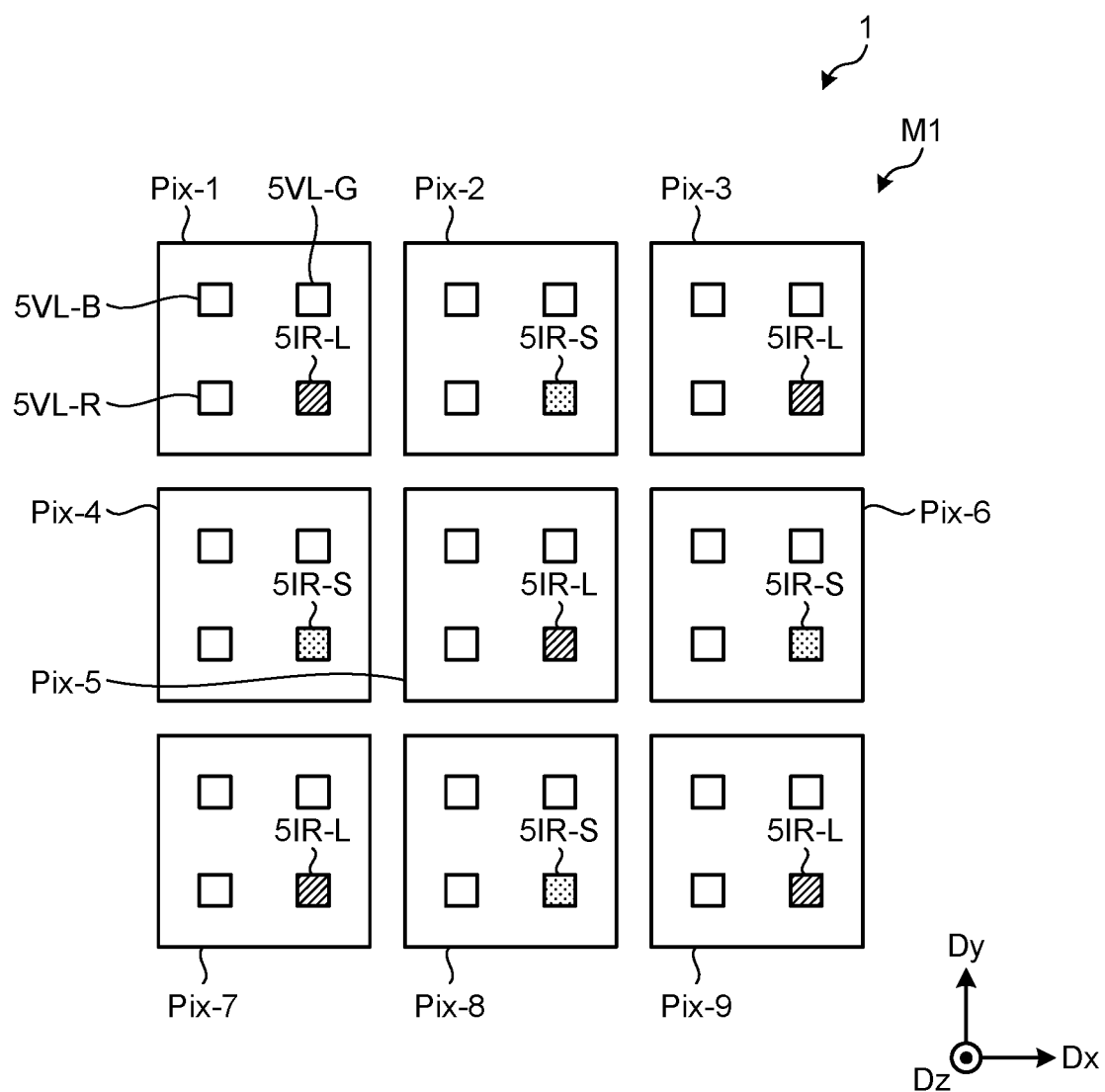
FIG. 3 is a plan view of a plurality of pixel groups.

FIG. 3 is a plan view of a plurality of pixel groups. As illustrated in FIG. 3, the pixel groups Pix are arrayed in a matrix (row-column configuration). The second light emitting elements 5IR include second light emitting elements 5IR-L for a light source and second light emitting elements 5IR-S for detection. The second light emitting element 5IR-L for the light source and the second light emitting element 5IR-S for detection have the same structure, that is, a p-n or p-i-n junction diode structure. The second light emitting element 5IR-L for the light source outputs the second light by being driven in forward bias. The second light emitting element 5IR-S for detection outputs signals based on the second light incident thereon by being driven in reverse bias.

Pixel groups Pix-1, Pix-3, Pix-5, Pix-7, and Pix-9 each include the second light emitting element 5IR-L for the light source. Pixel groups Pix-2, Pix-4, Pix-6, and Pix-8 each include the second light emitting element 5IR-S for detection. In other words, the pixel groups Pix including the second light emitting element 5IR-L for the light source and the pixel groups Pix including the second light emitting element 5IR-S for detection are alternately arrayed in the first direction Dx and the second direction Dy.

With this configuration, the second light in the infrared light region output from the second light emitting elements 5IR-L for the light source is reflected on the surface or inside of the finger Fin or the like. The second light emitting elements 5IR-S for detection can detect biological information, such as a fingerprint and a vein pattern, by detecting the reflected second light. The ratio of the number of second light emitting elements 5IR-L for the light source to the number of second light emitting elements 5IR-S for detection is 1:1. Consequently, the display device 1 can perform detection in high definition.

The positions of the second light emitting elements 5IR-L for the light source and the second light emitting elements 5IR-S for detection are not limited to those illustrated in FIG. 3. A plurality of second light emitting elements 5IR-S for detection may be provided corresponding to one second light emitting element 5IR-L for the light source. Alternatively, a plurality of second light emitting elements 5IR-L for the light source may be provided corresponding to one second light emitting element 5IR-S for detection. The pixel groups Pix may include a pixel group Pix not including the second light emitting element 5IR.

Figure 4:
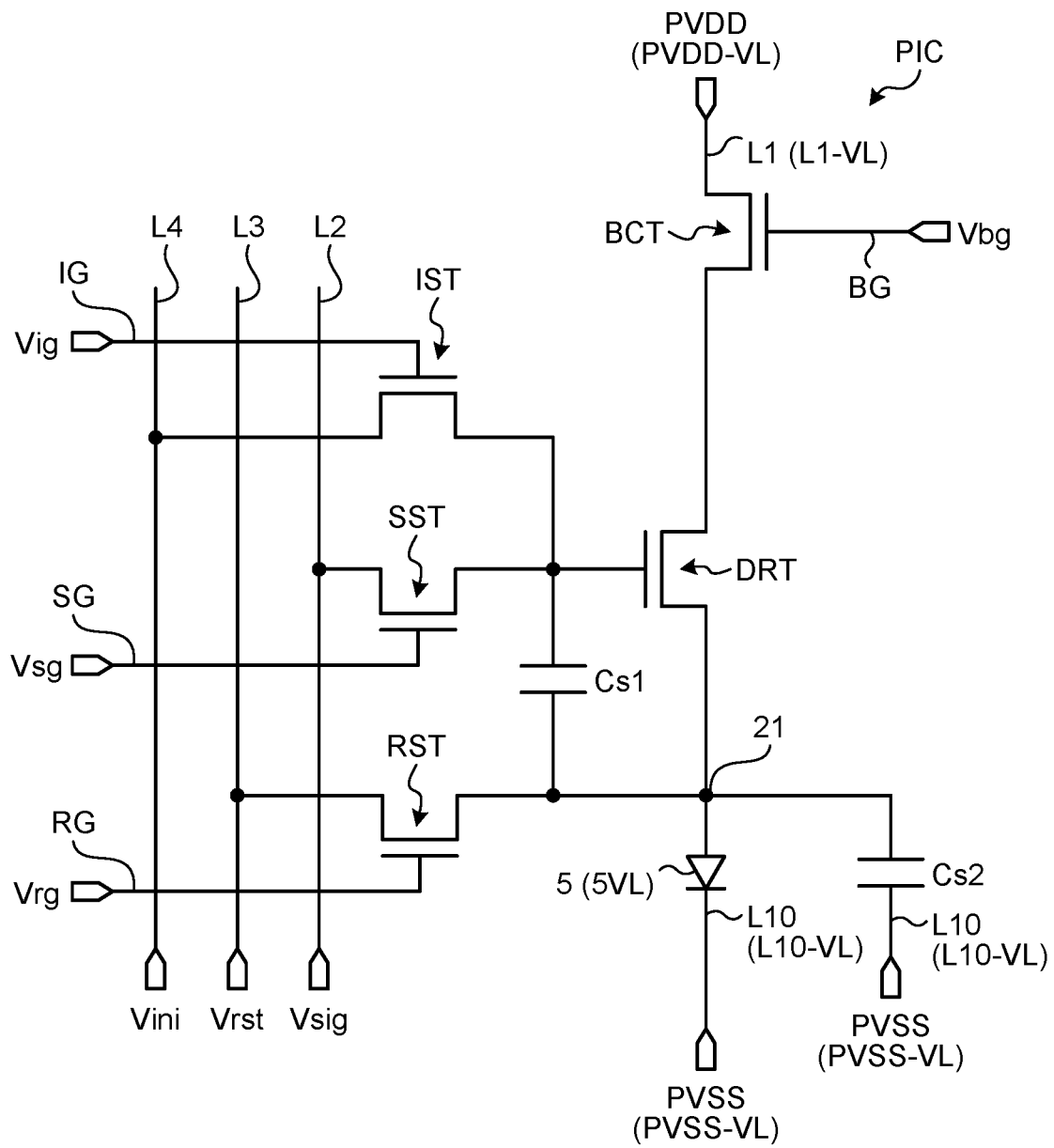
FIG. 4 is a circuit diagram of a pixel circuit that drives a first light emitting element.

FIG. 4 is a circuit diagram of a pixel circuit that drives the first light emitting element. A pixel circuit PIC illustrated in FIG. 4 is provided to each of the first pixel 20R, the second pixel 20G, and the third pixel 20B. The pixel circuit PIC is provided to the substrate 10 and supplies drive signals (electric current) to the first light emitting element 5VL. Explanation of the pixel circuit PIC with reference to FIG. 4 is also applicable to the pixel circuits PIC included in the first pixel 20R, the second pixel 20G, and the third pixel 20B.

As illustrated in FIG. 4, the pixel circuit PIC includes the first light emitting element 5VL, five transistors, and two capacitances. Specifically, the pixel circuit PIC includes a light emission control transistor BCT, an initialization transistor IST, a writing transistor SST, a reset transistor RST, and a drive transistor DRT. Some of the transistors may be shared by the pixels 20 disposed side by side.

The transistors included in the pixel circuit PIC are n-type TFTs (thin-film transistors). The present embodiment is not limited thereto, and the transistors may be p-type TFTs.

The light emission control scanning line BG is coupled to the gate of the light emission control transistor BCT. The initialization control scanning line IG is coupled to the gate of the initialization transistor IST. The writing control scanning line SG is coupled to the gate of the writing transistor SST. The reset control scanning line RG is coupled to the gate of the reset transistor RST.

The light emission control scanning line BG, the initialization control scanning line IG, the writing control scanning line SG, and the reset control scanning line RG are coupled to the drive circuits 12 (refer to FIG. 1) provided in the peripheral region GA. The drive circuits 12 supply light emission control signals Vbg, initialization control signals Vig, writing control signals Vsg, and reset control signals Vrg to the light emission control scanning line BG, the initialization control scanning line IG, the writing control scanning line SG, and the reset control scanning line RG, respectively.

The drive IC 210 (refer to FIG. 1) supplies video signals Vsig to the respective pixel circuits PIC of the first pixel 20R, the second pixel 20G, and the third pixel 20B in a time-division manner. A switching circuit, such as a multiplexer, is provided between each row of the first pixels 20R, the second pixels 20G, and the third pixels 20B and the drive IC 210. The video signals Vsig are supplied to the writing transistor SST via a video signal line L2. The drive IC 210 supplies reset power supply potential Vrst to the reset transistor RST via a reset signal line L3. The drive IC 210 supplies initialization potential Vini to the initialization transistor IST via an initialization signal line L4.

The light emission control transistor BCT, the initialization transistor IST, the writing transistor SST, and the reset transistor RST each function as a switching element that selects electrical continuity and discontinuity between two nodes. The drive transistor DRT functions as an electric current control element that controls an electric current flowing through the first light emitting element 5VL based on voltage between the gate and the drain.

The cathode (cathode terminal 53-VL) of the first light emitting element 5VL is coupled to a cathode power supply line L10-VL. The anode (anode terminal 52-VL) of the first light emitting element 5VL is coupled to an anode power supply line L1-VL (first power supply line) via the drive transistor DRT and the light emission control transistor BCT. The anode power supply line L1-VL is supplied with anode power supply potential PVDD-VL. The cathode power supply line L10-VL is supplied with cathode power supply potential PVSS-VL. The anode power supply potential PVDD-VL is higher than the cathode power supply potential PVSS-VL. The cathode power supply line L10-VL includes the cathode wiring 14.

The pixel circuit PIC includes the capacitance Cs1 and the capacitance Cs2. The capacitance Cs1 is holding capacitance formed between the gate and the source of the drive transistor DRT. The capacitance Cs2 is additional capacitance formed between the cathode power supply line L10-VL and both the source of the drive transistor DRT and the anode of the first light emitting element 5VL.

The display device 1 drives the pixels 20 in the first row to the pixels 20 in the last row, thereby performing a frame period for displaying an image of one frame.

In a reset period, the light emission control transistor BCT is turned off (electrically discontinuous state), and the reset transistor RST is turned on (electrically continuous state) based on the electric potential of the light emission control scanning line BG and the reset control scanning line RG. As a result, the electric potential of the source of the drive transistor DRT is fixed to the reset power supply potential Vrst. The reset power supply potential Vrst is set to be a potential such that the potential difference between the reset power supply potential Vrst and the cathode power supply potential PVSS is smaller than the potential difference at which the first light emitting element 5VL starts to emit light.

Subsequently, the initialization transistor IST is turned on based on the electric potential of the initialization control scanning line IG. The electric potential of the gate of the drive transistor DRT is fixed to the initialization potential Vini by the initialization transistor IST. The drive circuits 12 turn on the light emission control transistor BCT and turn off the reset transistor RST. When the source potential is equal to (Vini-Vth), the drive transistor DRT is turned off. As a result, variations in a threshold voltage Vth of the drive transistors DRT of the respective pixels 20 are offset.

In a subsequent video signal writing operation period, the light emission control transistor BCT is turned off, the initialization transistor IST is turned off, and the writing transistor SST is turned on. The video signals Vsig are input to the gate of the drive transistor DRT.

In a subsequent light emission operation period, the light emission control transistor BCT is turned on, and the writing transistor SST is turned off. The anode power supply potential PVDD is supplied to the drive transistor DRT from the anode power supply line L1-VL via the light emission control transistor BCT. The drive transistor DRT supplies an electric current corresponding to the gate-source voltage to the first light emitting element 5VL. The first light emitting element 5VL emits light with the luminance corresponding to the electric current.

The configuration of the pixel circuit PIC illustrated in FIG. 4 is given by way of example only and may be appropriately modified. The number of wires and the number of transistors in one pixel 20, for example, may be different from those described above.

Figure 5:
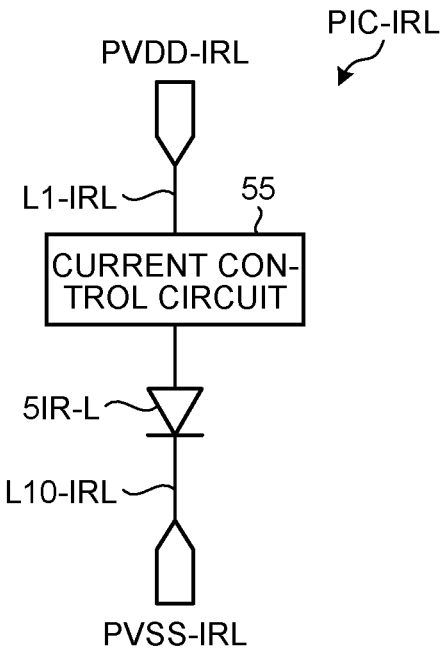
FIG. 5 is a circuit diagram of a pixel circuit that drives a second light emitting element for a light source.

FIG. 5 is a circuit diagram of a pixel circuit that drives the second light emitting element for the light source. As illustrated in FIG. 5, a pixel circuit PIC-IRL includes an anode power supply line L1-IRL, a cathode power supply line L10-IRL, and a current control circuit 55. An anode terminal 52-IRL of the second light emitting element 5IR-L for the light source is supplied with an anode power supply potential PVDD-IRL (first potential) via the anode power supply line L1-IRL. A cathode terminal 53-IRL of the second light emitting element 5IR-L for the light source is supplied with a cathode power supply potential PVSS-IRL (second potential) via the cathode power supply line L10-IRL. With this configuration, the second light emitting element 5IR-L for the light source is driven in forward bias.

The current control circuit 55 is coupled to the anode power supply line L1-IRL. The current control circuit 55 controls drive signals (electric current) supplied to the second light emitting element 5IR-L for the light source. The current control circuit 55 has a circuit configuration including a plurality of transistors like the pixel circuit PIC illustrated in FIG. 4, for example. The current control circuit 55 is supplied with detection control signals instead of the video signals Vsig. The second light emitting element 5IR-L outputs the second light serving as infrared light and does not output the first light for displaying an image. The anode power supply potential PVDD-IRL and the cathode power supply potential PVSS-IRL supplied to the second light emitting element 5IR-L for the light source may be the same as or different from the anode power supply potential PVDD-VL and the cathode power supply potential PVSS-VL in the pixel circuit PIC illustrated in FIG. 4. In other words, the anode power supply line L1-IRL coupled to the second light emitting element 5IR-L may be wiring different from the anode power supply line L1-VL coupled to the first light emitting element 5VL. The cathode power supply line L10-IRL coupled to the second light emitting element 5IR-L may be wiring different from the cathode power supply line L10-VL coupled to the first light emitting element 5VL.

Figure 6:
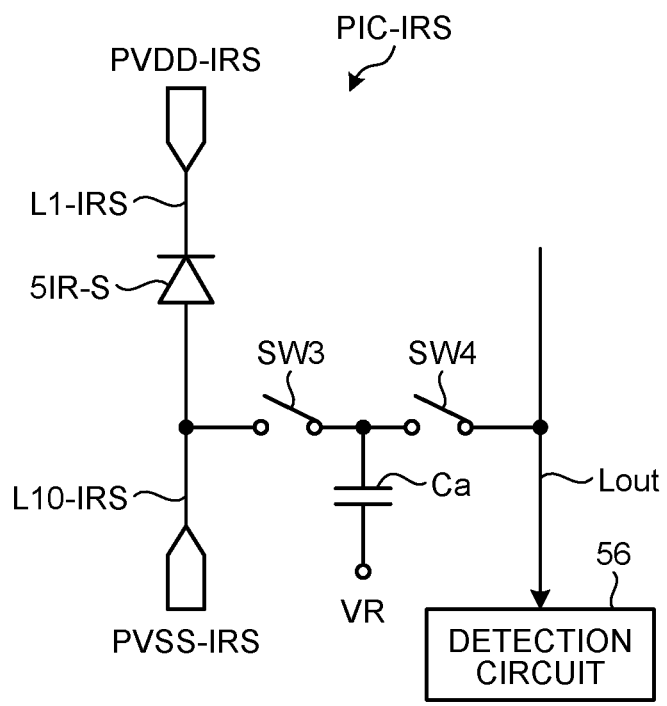
FIG. 6 is a circuit diagram of a pixel circuit that drives a second light emitting element for detection.

FIG. 6 is a circuit diagram of a pixel circuit that drives the second light emitting element for detection. As illustrated in FIG. 6, a pixel circuit PIC-IRS includes an anode power supply line L1-IRS, a cathode power supply line L10-IRS, a third switch element SW3, a fourth switch element SW4, capacitance Ca, and a signal output line Lout. An anode terminal 52-IRS of the second light emitting element 5IR-S for detection is supplied with a cathode power supply potential PVSS-IRS (second potential) via the cathode power supply line L10-IRS. A cathode terminal 53-IRS of the second light emitting element 5IR-S for detection is supplied with an anode power supply potential PVDD-IRS (first potential) via the anode power supply line L1-IRS. With this configuration, the second light emitting element 5IR-S for detection is driven in reverse bias.

The capacitance Ca is supplied with a reference potential VR. When the third switch element SW3 is turned on, and the fourth switch element SW4 is turned off based on the control signals received from the drive IC 210, the second light emitting element 5IR-S for detection is coupled to the capacitance Ca. An electric current based on the incident second light flows from the second light emitting element 5IR-S to the capacitance Ca. As a result, electric charges are accumulated in the capacitance Ca.

When the third switch element SW3 is turned off, and the fourth switch element SW4 is turned on based on the control signals received from the drive IC 210, the capacitance Ca is coupled to the signal output line Lout. An electric current based on the electric charges accumulated in the capacitance Ca flows through the signal output line Lout. The display device 1 includes a detection circuit 56 coupled to the signal output line Lout. The detection circuit 56 detects signals corresponding to the amount of second light incident on the second light emitting elements 5IR-S for detection. The detection circuit 56 may be included in the drive IC 210 or an IC provided to a wiring substrate coupled to the substrate 10.

The anode power supply potential PVDD-IRS and the cathode power supply potential PVSS-IRS supplied to the second light emitting element 5IR-S for detection may be the same as or different from the anode power supply potential PVDD-VL and the cathode power supply potential PVSS-VL in the pixel circuit PIC illustrated in FIG. 4. If the cathode terminal 53-VL of the first light emitting element 5VL and the cathode terminal 53-IRS of the second light emitting element 5IR-S for detection are coupled to a common cathode electrode 22-VL, the cathode terminal 53-IRS of the second light emitting element 5IR-S for detection is supplied with the cathode power supply potential PVSS-VL illustrated in FIG. 4 as the first potential. In this case, the anode terminal 52-IRS of the second light emitting element 5IR-S for detection simply needs to be supplied with an electric potential lower than the cathode power supply potential PVSS-VL as the second potential. In other words, the anode power supply line L1-IRS coupled to the second light emitting element 5IR-S may be wiring different from the anode power supply line L1-VL coupled to the first light emitting element 5VL. The cathode power supply line L10-IRS coupled to the second light emitting element 5IR-S may be wiring different from the cathode power supply line L10-VL coupled to the first light emitting element 5VL.

Figure 7:
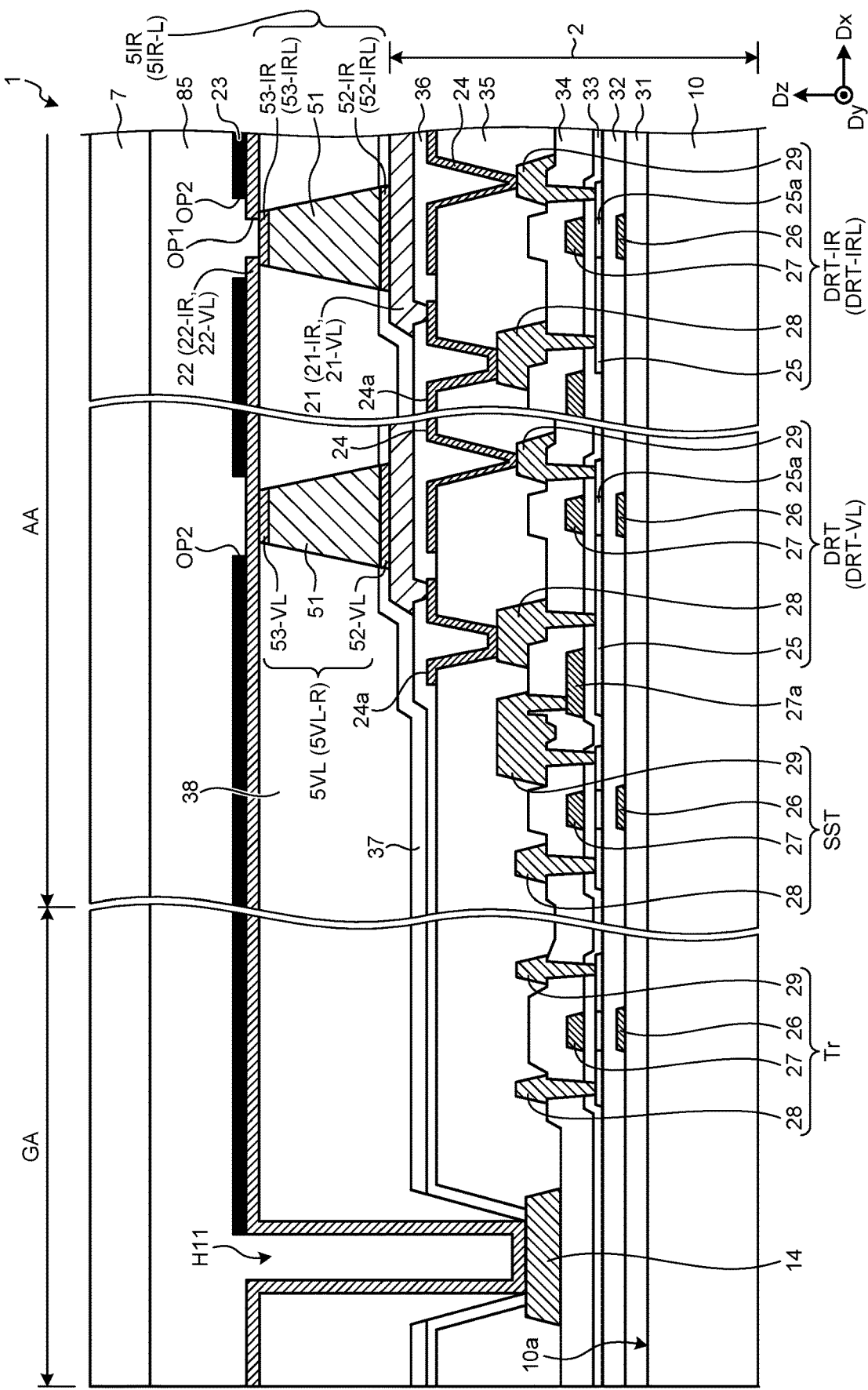
FIG. 7 is a sectional view along line VII-VII' of FIG. 1.

The following describes a sectional configuration of the display device 1. FIG. 7 is a sectional view along line VII-VII' of FIG. 1. As illustrated in FIG. 7, the light emitting elements 5 are provided on the array substrate 2 in the display device 1. While FIG. 7 illustrates a sectional configuration of the first light emitting element 5VL-R and the second light emitting element 5IR-L for the light source, explanation of the first light emitting element 5VL-R is also applicable to the first light emitting elements 5VL-G and 5VL-B.

The array substrate 2 includes the substrate 10, the anode electrodes 21, counter electrodes 24, coupling electrodes 24a, and various kinds of transistors, wiring, and insulating films. The substrate 10 is an insulating substrate and is a glass substrate made of quartz or alkali-free glass or a resin substrate made of polyimide, for example. The anode electrodes 21 include anode electrodes 21-VL, anode electrodes 21-IRL, and anode electrodes 21-IRS. In the following description, the anode electrode 21-VL, the anode electrode 21-IRL, and the anode electrode 21-IRS are simply referred to as the anode electrodes 21 when they need not be distinguished from one another. The anode electrode 21-IRL and the anode electrode 21-IRS are simply referred to as the anode electrodes 21-IR coupled to the second light emitting element IR when they need not be distinguished from each other.

In the present specification, a direction from the substrate 10 toward the light emitting element 5 in a direction perpendicular to the surface of the substrate 10 is referred to as an "upper side" or simply as "up". A direction from the light emitting element 5 to the substrate 10 is referred to as a "lower side" or simply as "down". To describe an aspect where a first structure is disposed on a second structure, the term "on" includes both of the following cases unless otherwise noted: a case where the first structure is disposed directly on the second structure in contact with the second structure, and a case where the first structure is disposed on the second structure with another structure interposed therebetween.

An undercoat film 31 is provided on the substrate 10. The undercoat film 31, insulating films 32, 33, and 34, and insulating films 36 and 37 are inorganic insulating films made of silicon oxide ($SiO_2$) or silicon nitride (SiN), for example.

The drive transistor DRT is provided on the undercoat film 31. While FIG. 7 illustrates the drive transistor DRT and the writing transistor SST out of the transistors, the light emission control transistor BCT, the initialization transistor IST, and the reset transistor RST included in the pixel circuit PIC also have the same multilayered structure as that of the drive transistor DRT. A drive transistor DRT-IRL included in the current control circuit 55 coupled to the second light emitting element 5IR-L for the light source also has the same configuration as that of the drive transistor DRT coupled to the first light emitting element 5VL-R. Switch elements SW1, SW2, SW3, and SW4 coupled to the second light emitting element 5IR also have the same configuration as that of the drive transistor DRT coupled to the first light emitting element 5VL. A transistor Tr included in the drive circuits 12 is provided in the peripheral region GA. In the following description, a drive transistor DRT-IV of the first light emitting element 5VL and a drive transistor DRT-VL of the second light emitting element 5IR-L for the light source are simply referred to as the drive transistors DRT when they need not be distinguished from each other.

The drive transistor DRT includes a semiconductor layer 25, a first gate electrode 26, a second gate electrode 27, a source electrode 28, and a drain electrode 29. The first gate electrode 26 is provided on the undercoat film 31. The insulating film 32 is provided on the undercoat film 31 to cover the first gate electrode 26. The semiconductor layer 25 is provided on the insulating film 32. The semiconductor layer 25 is made of polycrystalline silicon, for example. The material of the semiconductor layer 25 is not limited thereto, and the semiconductor layer 25 may be made of a microcrystalline oxide semiconductor, an amorphous oxide semiconductor, or low-temperature polycrystalline silicon, for example.

The insulating film 33 is provided on the insulating film 32 to cover the semiconductor layer 25. The second gate electrode 27 is provided on the insulating film 33. In the semiconductor layer 25, the part sandwiched by the first gate electrode 26 and the second gate electrode 27 serves as a channel region 25a. While only an n-type TFT is provided as the drive transistor DRT, a p-type TFT may be simultaneously formed.

First wiring 27a is provided in the same layer as that of the second gate electrode 27. The first gate electrode 26, the second gate electrode 27, and the first wiring 27a are made of aluminum (Al), copper (Cu), silver (Ag), molybdenum (Mo), or an alloy film of these metals, for example. The drive transistor DRT has a dual-gate structure provided with the first gate electrode 26 and the second gate electrode 27. The structure of the drive transistor DRT is not limited thereto, and the drive transistor DRT may have a bottom-gate structure provided with the first gate electrode 26 alone or a top-gate structure provided with the second gate electrode 27 alone.

The source electrode 28 and the drain electrode 29 are each coupled to the semiconductor layer 25 through a contact hole formed in the insulating films 33 and 34. The source electrode 28 and the drain electrode 29 are multilayered films of TiAlTi or TiAl, which is a multilayered structure of titanium (Ti) and Al, for example.

The first wiring 27a and the source electrode 28 facing each other with the insulating film 34 interposed therebetween form capacitance Cs1. The capacitance Cs1 includes capacitance formed by the semiconductor layer 25 and the first wiring 27a facing each other with the insulating film 32 interposed therebetween.

While the explanation has been made on the configuration of the drive transistor DRT out of the transistors included in the pixel circuit PIC, the pixel circuit PIC-IRL, and the pixel circuit PIC-IRS with reference to FIG. 7, the transistors, such as the writing transistor SST, included in the pixel circuit PIC and the transistor Tr provided in the peripheral region GA also have the same sectional configuration as that of the drive transistor DRT. For this reason, detailed explanation of these transistors is omitted herein.

An insulating film 35 is provided on the insulating film 34 to cover the drive transistor DRT. The insulating film 35 is made of organic material, such as photosensitive acrylic. The insulating film 35 is a flattening film that can flatten unevenness formed by the drive transistor DRT and various kinds of wiring.

The counter electrode 24, the insulating film 36, the anode electrode 21, and the insulating film 37 are layered in order on the insulating film 35. The counter electrode 24 is made of translucent conductive material, such as indium tin oxide (ITO). The coupling electrode 24a is provided in the same layer as that of the counter electrode 24. The coupling electrode 24a is coupled to the source electrode 28 at the bottom of a contact hole.

The anode electrode 21 is electrically coupled to the coupling electrode 24a and the source electrode 28 through a contact hole formed in the insulating film 36. As a result, the anode electrode 21 is electrically coupled to the drive transistor DRT. The anode electrode 21 has a multilayered structure of Mo and Al, for example. The anode electrode 21 may be made of metal or alloy including at least one of Mo and Ti or translucent conductive material.

The capacitance Cs2 is formed between the anode electrode 21 and the counter electrode 24 facing each other with the insulating film 36 interposed therebetween. The insulating film 37 covers the periphery of the anode electrode 21 and insulates the anode electrodes 21 of the pixels 20 disposed side by side.

The insulating film 37 has an opening for mounting the light emitting element 5 at a position overlapping the anode electrode 21. The size of the opening of the insulating film 37 is larger than the area of the light emitting element 5 considering the amount of mounting misalignment in the process of mounting the light emitting element 5, for example. The anode terminals 52 include the anode terminal 52-VL, the anode terminal 52-IRL, and the anode terminal 52-IRS. In the following description, the anode terminal 52-VL, the anode terminal 52-IRL, and the anode terminal 52-IRS are simply referred to as the anode terminals 52 when they need not be distinguished from one another. The anode terminal 52-IRL and the anode terminal 52-IRS are simply referred to as the anode terminals 52-IR when they need not be distinguished from each other. The cathode terminals 53 include the cathode terminal 53-VL, the cathode terminal 53-IRL, and the cathode terminal 53-IRS. In the following description, the cathode terminal 53-VL, the cathode terminal 53-IRL, and the cathode terminal 53-IRS are simply referred to as the cathode terminals 53 when they need not be distinguished from one another. The cathode terminal 53-IRL and the cathode terminal 53-IRS are simply referred to as the cathode terminals 53-IR when they need not be distinguished from each other.

The first light emitting element 5VL is mounted such that the anode terminal 52-VL is in contact with the anode electrode 21-VL. The anode electrode 21-VL supplies the anode power supply potential PVDD-VL to the anode terminal 52-VL of the first light emitting element 5VL. The second light emitting element 5IR-L for the light source and the second light emitting element 5IR-S for detection are also mounted such that the anode terminals 52-IRL and 52-IRS are in contact with the anode electrodes 21-IRL and 21-IRS, respectively. The second light emitting element 5IR-S for detection may be mounted in the opposite direction to the second light emitting element 5IR-L for the light source. In other words, the second light emitting element 5IR-S for detection may be mounted such that the cathode terminal 53 is in contact with the anode electrode 21 and may be driven in reverse bias.

The light emitting element 5 includes a semiconductor layer 51, the anode terminal 52, and the cathode terminal 53. The semiconductor layer 51 has a multilayered structure of an n-type cladding layer, an active layer, and a p-type cladding layer. The semiconductor layer 51 is made of a compound semiconductor, such as gallium nitride (GaN), aluminum indium gallium phosphorous (AlInGaP), aluminum gallium arsenide (AlGaAs), gallium arsenide phosphorous (GaAsP), and gallium arsenide (GaAs). The semiconductor layer 51 may be made of different materials depending on the first light emitting element 5VL and the second light emitting element 5IR. The active layer may have a multi-quantum well structure (MQW structure) in which well layers and barrier layers composed of several atomic layers are cyclically layered for high efficiency.

An element insulating film 38 is provided between a plurality of light emitting elements 5. The element insulating film 38 is made of resin material. The element insulating film 38 covers the side surfaces of the light emitting element 5 at least, and the element insulating film 38 is not provided on the cathode terminal 53 of the light emitting element 5. The element insulating film 38 is flattened such that the upper surface of the element insulating film 38 and the upper surface of the cathode terminal 53 form a single plane. The position of the upper surface of the element insulating film 38 may be different from that of the upper surface of the cathode terminal 53.

The cathode electrode 22 covers a plurality of light emitting elements 5 and the element insulating film 38 and is electrically coupled to the light emitting elements 5. More specifically, the cathode electrode 22 is provided over the upper surface of the element insulating film 38 and the upper surface of the cathode terminals 53 of the first light emitting element 5VL and the second light emitting element SIR. The cathode electrode 22 is made of translucent conductive material, such as ITO. This configuration can effectively extract light output from the light emitting elements 5 to the outside. In the second light emitting element 5IR-S for detection, the cathode electrode 22-IRS may be coupled to the anode terminal 52-IRS, and the anode electrode 21-IRS may be coupled to the cathode terminal 53-IRS. The cathode electrodes 22 include cathode electrodes 22-VL, cathode electrodes 22-IRL, and cathode electrodes 22-IRS. In the following description, the cathode electrode 22-VL, the cathode electrode 22-IRL, and the cathode electrode 22-IRS are simply referred to as the cathode electrodes 22 when they need not be distinguished from one another. The cathode electrode 22-IRL and the cathode electrode 22-IRS are simply referred to as the cathode electrodes 22-IR coupled to the second light emitting element IR when they need not be distinguished from each other. The cathode electrode 22 is composed of a plurality of conductive layers layered with insulating layers interposed therebetween. The cathode electrode 22-VL and the cathode electrode IRL may be made of different conductive layers and be electrically insulated from each other.

The cathode electrode 22 is coupled to the cathode wiring 14 provided to the array substrate 2 through a contact hole H11 formed outside the display region AA. Specifically, the contact hole H11 is formed in the element insulating film 38 and the insulating film 35, and the cathode wiring 14 is provided on the bottom surface of the contact hole H11. The cathode wiring 14 is provided on the insulating film 34. In other words, the cathode wiring 14 is provided in the same layer and is made of the same material as that of the source electrode 28 and the drain electrode 29. The cathode electrode 22 is continuously provided from the display region AA to the peripheral region GA and is coupled to the cathode wiring 14 at the bottom of the contact hole H11.

A black member 23 is provided on the cathode electrode 22. The black member 23 is a low reflective film made of material having light reflectance lower than that of the anode electrode 21, for example. The black member 23 is made of resin material colored in black, carbon, or metal or metal oxide that shows black by thin-film interference.

The black member 23 has a second opening OP2 in a region overlapping the first light emitting element 5VL. In other words, the cathode electrode 22 is in contact with an adhesive layer 85 in the second opening OP2 on the first light emitting element 5VL. In the part around the second opening OP2, the black member 23 provided on the cathode electrode 22 is in contact with the adhesive layer 85. Light output from the first light emitting element 5VL travels toward the display surface through the second opening OP2 and is displayed as a display image.

Light output sideward or downward from the first light emitting element 5VL is reflected by various kinds of wiring of the array substrate 2. The black member 23 blocks the light reflected by the array substrate 2, thereby preventing the reflected light from being output toward the display surface. The black member 23 absorbs external light incident on the display surface, thereby preventing the external light from entering into the array substrate 2. This configuration can prevent the reflected light from being visually recognized by an observer. Consequently, the display device 1 can prevent color mixture in light between the pixels 20 and prevent unintended and unnecessary light from being output from the display surface. As a result, the display device 1 can prevent deterioration of the quality of a display image.

The cathode electrode 22 has a first opening OP1, and the black member 23 has the second opening OP2 in a region overlapping the second light emitting element 5IR. The second opening OP2 is formed in a region overlapping the first opening OP1. The cathode electrode 22 is coupled to the peripheral part of the cathode terminal 53. The adhesive layer 85 is provided along the step formed by the first opening OP1 and the second opening OP2. The cathode terminal 53 is in contact with the adhesive layer 85 on the second light emitting element 5IR.

This configuration allows the second light in the infrared light region output from the second light emitting element 5IR-L for the light source to travel toward the display surface through the first opening OP1 and the second opening OP2 not via the cathode electrode 22 or the black member 23. The second light reflected by the finger Fin or the like passes through the first opening OP1 and the second opening OP2 and is incident on the second light emitting element 5IR-S for detection. Consequently, the display device 1 can prevent reduction in intensity of the second light in the infrared light region incident on the finger Fin compared with a case where the second light is output from the second light emitting element 5IR-L for the light source and passes through the cathode electrode 22 made of ITO or the like. Alternatively, the display device 1 can prevent reduction in intensity of the second light incident on the second light emitting element 5IR-S for detection compared with a case where the second light passes through the cathode electrode 22 and is incident on the second light emitting element 5IR-S for detection.

A circularly polarizing plate 7 is provided on the cathode electrode 22 and the black member 23 with the adhesive layer 85 interposed therebetween. In other words, the light emitting elements 5 are provided between the substrate 10 and the circularly polarizing plate 7 in the direction perpendicular to the substrate 10. The circularly polarizing plate 7 includes a linearly polarizing plate and a quarter retardation plate (also called a quarter wavelength plate) provided on a first surface of the linearly polarizing plate, for example. The quarter retardation plate is provided at a position closer to the substrate 10 than the linearly polarizing plate is.

External light (incident light), for example, passes through the linearly polarizing plate, thereby being converted into linearly polarized light. The linearly polarized light passes through the quarter retardation plate, thereby being converted into circularly polarized light. The circularly polarized light is reflected by the detection electrodes Rx and the wiring of the array substrate 2, thereby being converted into circularly polarized light (reflected light) turning in a direction opposite to the direction of the incident light. The reflected light passes through the quarter retardation plate again, thereby being converted into linearly polarized light orthogonal to the incident light and absorbed by the linearly polarizing plate. As a result, the display device 1 prevents reflection of external light.

Figure 8:
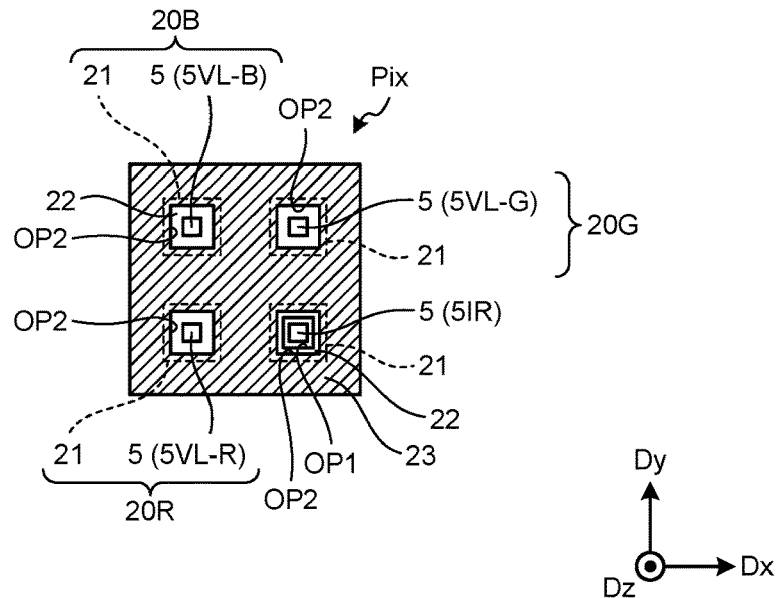
FIG. 8 is a plan view of a plurality of pixels and a cathode electrode.

FIG. 8 is a plan view of a plurality of pixels and the cathode electrode. In FIG. 8, the black member 23 is hatched. As illustrated in FIG. 8, the black member 23 is continuously provided between the pixels 20 disposed side by side. The first light emitting elements 5VL-R, 5VL-G, and 5VL-B and the second light emitting element 5IR are each provided in a region having the second opening OP2. The area of the second opening OP2 in planar view is larger than that of the corresponding light emitting element 5. The area of the second opening OP2 in planar view is larger than at least the area of the upper surface of the corresponding light emitting element 5.

In a region overlapping the second light emitting element 5IR, the area of the second opening OP2 in planar view is larger than that of the first opening OP1 of the cathode electrode 22. In other words, the width of the second opening OP2 in the first direction Dx is larger than that of the first opening OP1 in the first direction Dx. The width of the second opening OP2 in the second direction Dy is larger than that of the first opening OP1 in the second direction Dy.

This configuration can increase the extraction efficiency of the second light output from the second light emitting element 5IR-L for the light source. In addition, this configuration can prevent crosstalk between the pixels 20 because the second light reflected by the finger Fin is divided and separately incident on the second light emitting elements 5IR-S for detection. Consequently, the display device 1 can perform detection in high definition.

The configuration of the display device 1 can be appropriately modified. The cathode electrode 22 illustrated in FIGS. 7 and 8, for example, may have no first opening OP1 and be continuously provided on the upper surface of the second light emitting element 5IR.

As described above, the display device 1 includes the substrate 10, the pixel groups Pix (pixels), and the first light emitting elements 5VL (first inorganic light emitting elements) and the second light emitting elements 5IR (second inorganic light emitting elements) provided to the pixel groups Pix. The first light emitting elements 5VL and the second light emitting elements 5IR each include the anode terminal 52 and the cathode terminal 53. The first light emitting elements VL output first light in a visible light region, and the second light emitting elements 5IR output second light in an infrared light region.

With this configuration, the display device 1 can output the second light in the infrared light region from the second light emitting elements 5IR, thereby detecting biological information based on the second light. The second light emitting elements 5IR are provided separately from the first light emitting elements 5VL that display an image, and the second light in the infrared light region is not visually recognized by the observer. Consequently, the display device 1 can prevent deterioration of the quality of a display image due to detection of biological information.

The display device 1 may use not only the second light output from the second light emitting elements 5IR but also the first light serving as visible light output from the first light emitting elements 5VL to detect biological information. The display device 1 can output the first light to detect a fingerprint and output the second light to detect a vein pattern, for example. Consequently, the display device 1 can appropriately detect various kinds of biological information.

Second Embodiment

Figure 9:
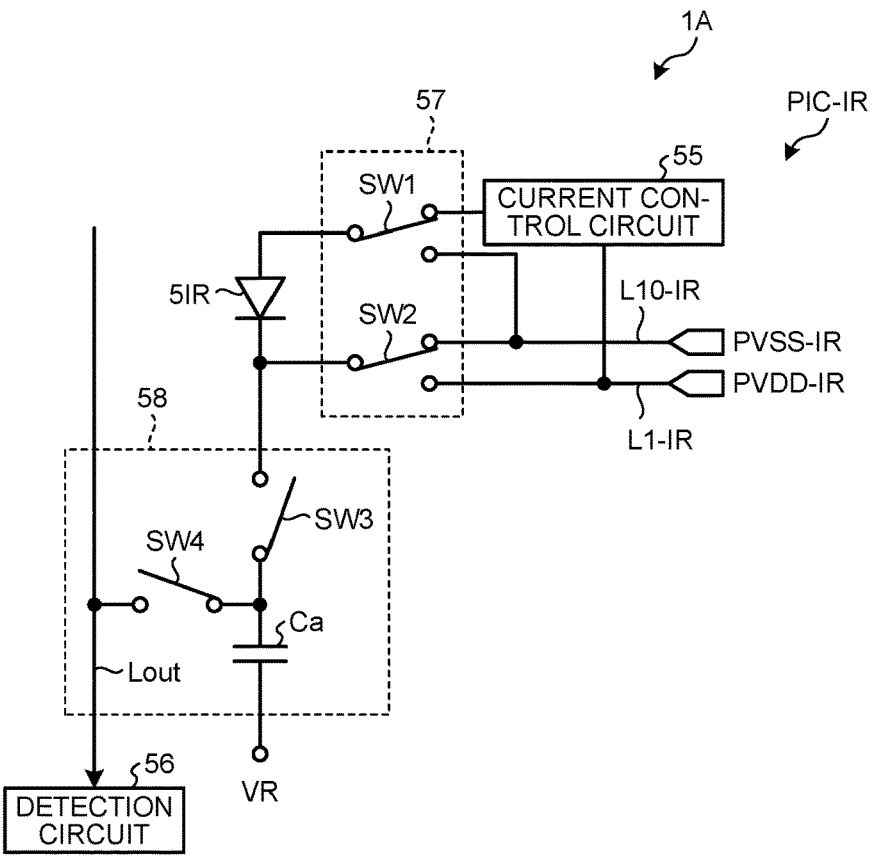
FIG. 9 is a circuit diagram of the pixel circuit that drives a second inorganic light emitting element in the display device according to a second embodiment.

FIG. 9 is a circuit diagram of the pixel circuit that drives the second inorganic light emitting element in the display device according to a second embodiment. In the following description, the same components as those described in the embodiment above are denoted by like reference numerals, and overlapping explanation thereof is omitted.

The first embodiment differently drives the second light emitting elements 5IR in units of the pixel group Pix. In other words, the pixel groups Pix according to the first embodiment each include the second light emitting element 5IR-L for the light source or the second light emitting element 5IR-S for detection. The present disclosure is not limited thereto, and a display device 1A according to the second embodiment can differently drive one second light emitting element 5IR in a time-division manner.

As illustrated in FIG. 9, a pixel circuit PIC-IR includes an anode power supply line L1-IR, a cathode power supply line L10-IR, a power supply line switching circuit 57, and a detection switching circuit 58. The power supply line switching circuit 57 includes a first switch element SW1 and a second switch element SW2. The anode power supply line L1-IR supplies an anode power supply potential PVDD-IR (first potential) to the second light emitting element 5IR. The cathode power supply line L10-IR supplies a cathode power supply potential PVSS-IR (second potential) to the second light emitting element 5IR. The first switch element SW1 switches a coupling destination of the anode terminal 52 of the second light emitting element 5IR between the anode power supply line L1-IR and the cathode power supply line L10-IR. The second switch element SW2 switches a coupling destination of the cathode terminal 53-IR of the second light emitting element 5IR between the anode power supply line L1-IR and the cathode power supply line L10-IR. The configuration of the third switch element SW3, the fourth switch element SW4, and the capacitance Ca of the detection switching circuit 58 is the same as that in the pixel circuit PIC-IRS illustrated in FIG. 6.

To use the second light emitting element 5IR as a light source, the first switch element SW1 couples the anode power supply line L1-IR to the anode terminal 52-IR of the second light emitting element 5IR based on the control signals received from the drive IC 210. In other words, the first switch element SW1 decouples the cathode power supply line L10-IR from the anode terminal 52-IR of the second light emitting element 5IR.

The second switch element SW2 couples the cathode power supply line L10-IR to the cathode terminal 53-IR of the second light emitting element 5IR based on the control signals received from the drive IC 210. In other words, the second switch element SW2 decouples the anode power supply line L1-IR from the cathode terminal 53-IR of the second light emitting element 5IR.

As a result, the anode terminal 52-IR of the second light emitting element 5IR is supplied with the anode power supply potential PVDD-IR (first potential), and the cathode terminal 53-IR is supplied with the cathode power supply potential PVSS-IR (second potential). In other words, the second light emitting element 5IR is driven in forward bias and is supplied with drive signals (electric current) via the current control circuit 55. The second light emitting element 5IR outputs the second light by the electric current supplied from the current control circuit 55.

In this case, the third switch element SW3 of the detection switching circuit 58 is turned off, and the electric current received from the second light emitting element 5IR does not flow through the capacitance Ca or the detection circuit 56. As a result, the second light emitting element 5IR operates as the second light emitting element 5IR-L for the light source.

To use the second light emitting element 5IR as a detection sensor, the first switch element SW1 couples the cathode power supply line L10-IR to the anode terminal 52-IR of the second light emitting element 5IR based on the control signals received from the drive IC 210. In other words, the first switch element SW1 decouples the anode power supply line L1-IR from the anode terminal 52-IR of the second light emitting element 5IR.

The second switch element SW2 couples the anode power supply line L1-IR to the cathode terminal 53-IR of the second light emitting element 5IR based on the control signals received from the drive IC 210. In other words, the second switch element SW2 decouples the cathode power supply line L10-IR from the cathode terminal 53-IR of the second light emitting element 5IR.

As a result, the cathode terminal 53-IR of the second light emitting element 5IR is supplied with the anode power supply potential PVDD-IR (first potential), and the anode terminal 52-IR is supplied with the cathode power supply potential PVSS-IR (second potential). In other words, the second light emitting element 5IR is driven in reverse bias and outputs an electric current based on the incident second light to the detection switching circuit 58. With this operation, the detection switching circuit 58 outputs the electric current received from the second light emitting element 5IR to the detection circuit 56. As a result, the second light emitting element 5IR operates as the second light emitting element 5IR-S for detection.

The display device LA according to the second embodiment can switch a single second light emitting element 5IR between being the second light emitting element 5IR-L for the light source and being the second light emitting element 5IR-S for detection in a time-division manner by operating the first switch element SW1 and the second switch element SW2 of the pixel circuit PIC-IR.

Figure 10:
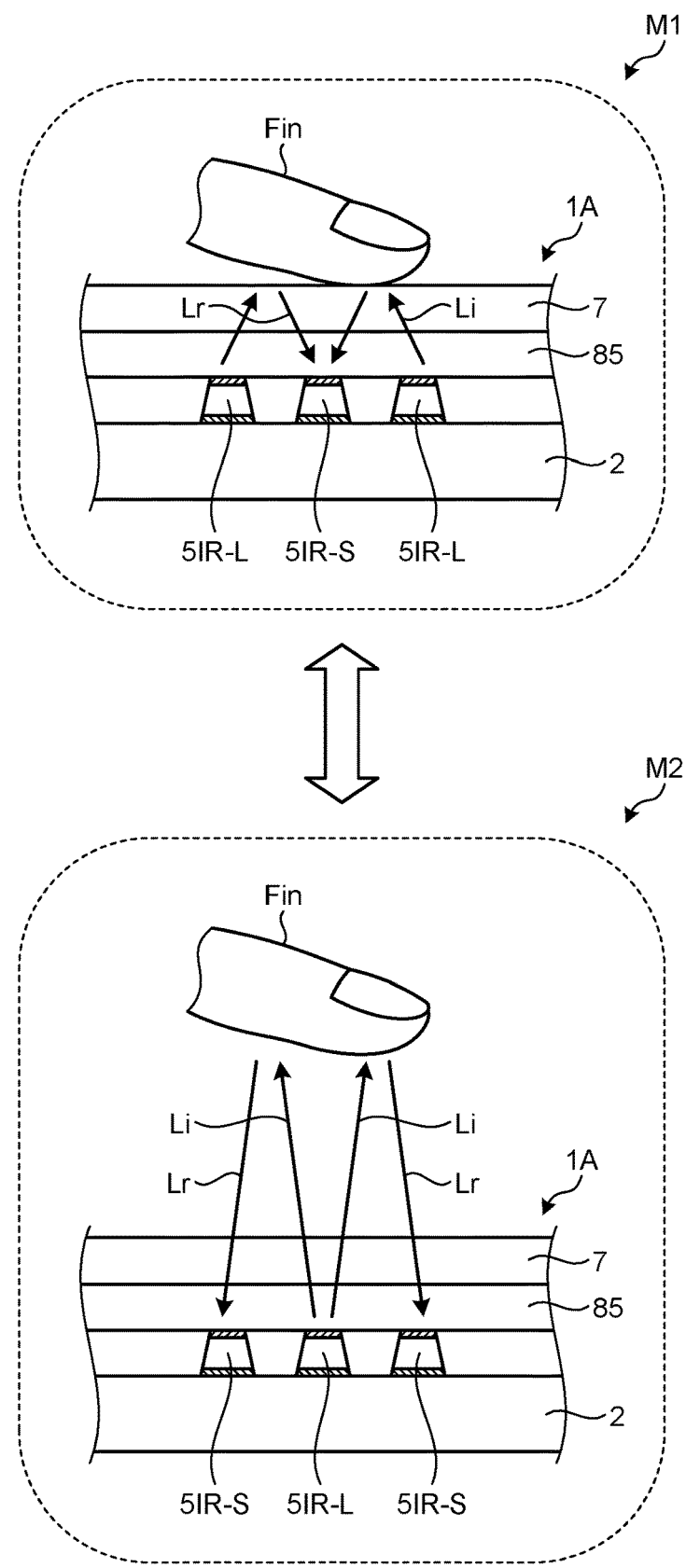
FIG. 10 is a view for explaining a first detection mode and a second detection mode.
Figure 11:
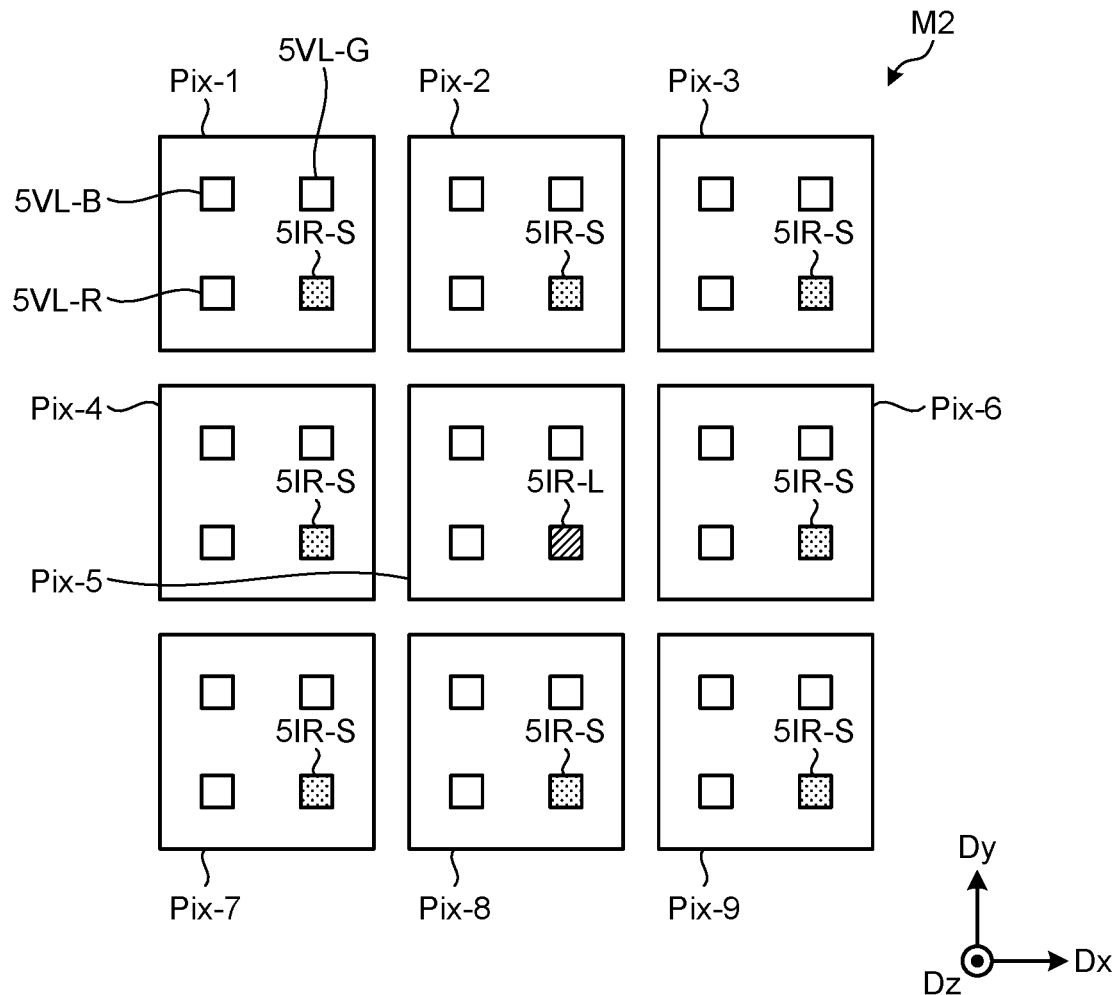
FIG. 11 is a plan view of an array of a plurality of second light emitting elements in the second detection mode.

FIG. 10 is a view for explaining a first detection mode and a second detection mode. FIG. 11 is a plan view of an array of a plurality of second light emitting elements in the second detection mode. As illustrated in FIG. 10, the display device 1A can switch between a first detection mode M1 and a second detection mode M2 in a time-division manner. The first detection mode M1 and the second detection mode M2 are different in the number of second light emitting elements 5IR-L for the light source and the number of second light emitting elements 5IR-S for detection.

The first detection mode M1 is a detection operation of detecting biological information on the finger Fin in contact with or in proximity to the display surface. In the first detection mode M1, output light Li output from the second light emitting elements 5IR-L for the light source is reflected by the finger Fin in contact with or in proximity to the display surface. The second light emitting elements 5IR-S for detection detect reflected light Lr, thereby detecting biological information on the finger Fin. The second detection mode M2 is a detection operation of detecting the finger Fin away from and not in contact with the display surface. In the second detection mode M2, the output light L1 output from the second light emitting elements 5IR-L for the light source is reflected by the finger Fin at a position away from the display surface. The second light emitting elements 5IR-S for detection detect the reflected light Lr, thereby detecting the position and the gesture of the finger Fin in the non-contact state. The second detection mode M2 is also called hover detection.

In the first detection mode M1, the pixel circuits PIC-IR of the respective pixel groups Pix each drive the second light emitting element IR. As a result, the second light emitting elements 5IR-L for the light source and the second light emitting elements 5IR-S for detection have the positional relation illustrated in FIG. 3, for example. In the first detection mode M1 illustrated in FIG. 3, the second light emitting elements 5IR-L for the light source and the second light emitting elements 5IR-S for detection are alternately arrayed. As a result, the display device 1A can make the arrangement pitch between the second light emitting elements 5IR-S for detection smaller to detect biological information, such as a finger print and a vein pattern, in high definition.

In the second detection mode M2, the pixel circuits PIC-IR of the respective pixel groups Pix each drive the second light emitting element IR. As a result, a plurality of second light emitting elements 5IR-S for detection are disposed surrounding one second light emitting element 5IR-L for the light source as illustrated in FIG. 11, for example. In FIG. 11, the pixel group Pix-5 includes the second light emitting element 5IR-L for the light source, and the pixel groups Pix-1 to Pix-4 and Pix-6 to Pix-9 each include the second light emitting element 5IR-S for detection. In other words, eight second light emitting elements 5IR-S for detection are provided corresponding to one second light emitting element 5IR-L for the light source in FIG. 11. In other words, the ratio of the number of second light emitting elements 5IR-S for detection to the number of second light emitting element 5IR-L for the light source is larger in the second detection mode M2 than in the first detection mode M1.

If the finger Fin is positioned away from the display surface of the display device 1A, and the intensity of the reflected light Lr reflected by the finger Fin is low in the second detection mode M2 as illustrated in FIG. 10, the display device 1A can detect the reflected light Lr with a larger number of second light emitting elements 5IR-S for detection than in the first detection mode M1. Consequently, the display device 1A can increase the detection sensitivity of the second light emitting elements 5IR-S for detection as a whole and satisfactorily perform hover detection.

The display device 1A can switch the second light emitting element 5IR-L for the light source and the second light emitting element 5IR-S for detection in units of the pixel group Pix. In other words, the positional relation of the second light emitting elements 5IR is not limited to that illustrated in FIGS. 3 and 11, and the second light emitting elements 5IR-L for the light source and the second light emitting elements 5IR-S for detection can be flexibly disposed. The display device 1A may change the ratio between the number of second light emitting elements 5IR-L for the light source and the number of second light emitting elements 5IR-S for detection depending on various kinds of biological information to be detected. The display device 1A may drive the second light emitting elements 5IR-L for the light source and the second light emitting elements 5IR-S for detection in a region overlapping the finger Fin in the display region AA and stop driving the second light emitting elements 5IR in the pixel groups Pix not overlapping the finger Fin.

Figure 12:
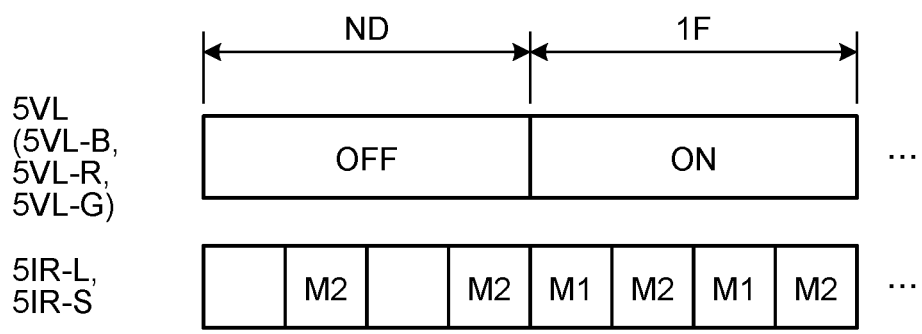
FIG. 12 is a diagram for explaining an example of the relation between the detection period of the first detection mode and the detection period of the second detection mode.

FIG. 12 is a diagram for explaining an example of the relation between the detection period of the first detection mode and the detection period of the second detection mode. The display device 1A may perform the first detection mode M1 and the second detection mode M2 in a time-division manner in any desired order.

As illustrated in FIG. 12, for example, the display device 1A may repeatedly perform the second detection mode M2 in a non-display period ND and alternately perform the first detection mode M1 and the second detection mode M2 in a frame period 1F. The non-display period ND is a period when the first light emitting elements 5VL are in a non-lighting state (OFF) to stop displaying an image. The non-display period ND includes a period when the display device 1A is turned off and a period in a sleep mode for stopping display if no input operation is performed for a predetermined period of time, for example.

The display device 1A performs the second detection mode M2 in the non-display period ND. Specifically, the display device 1A turns on the second light emitting elements 5IR-L for the light source and detects proximity of the finger Fin based on the signals received from the second light emitting elements 5IR-S for detection. If the finger Fin is not present, the display device 1A continues the non-display period ND. If the finger Fin is in a proximity state, the display device 1A performs the frame period 1F for displaying an image.

In the frame period 1F, the display device 1A turns on the first light emitting elements 5VL and displays an image. The display device 1A can perform detection in the first detection mode M1 and the second detection mode M2 in a period overlapping the frame period 1F because the second light emitting elements 5IR-L for the light source output the second light in the infrared light region. In this case, the second light output from the second light emitting elements 5IR-L for the light source is not visually recognized by the observer. Consequently, the display device 1A can prevent deterioration of the quality of a display image.

While the display device 1A alternately performs the first detection mode M1 and the second detection mode M2 in the frame period 1F in FIG. 12, the present disclosure is not limited thereto. The order of the first detection mode M1 and the second detection mode M2 can be appropriately modified. The display device 1A, for example, may repeatedly perform detection in the second detection mode M2 every predetermined period. If proximity or contact of the finger Fin is detected, the display device 1A may shift to detection in the first detection mode M1 and detect biological information.

Third Embodiment

Figure 13:
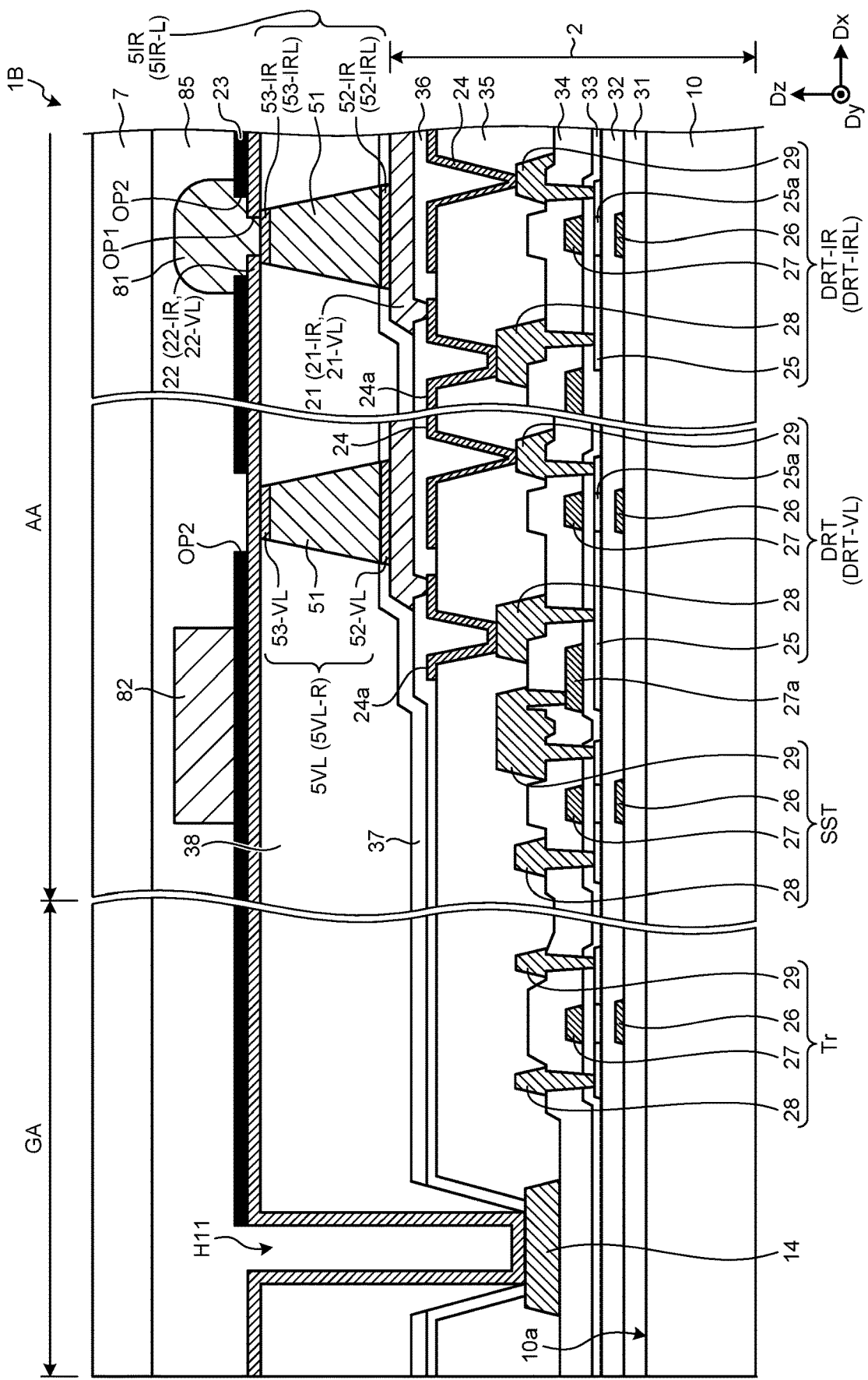
FIG. 13 is a sectional view of the display device according to a third embodiment.

FIG. 13 is a sectional view of the display device according to a third embodiment. As illustrated in FIG. 13, a display device 1B according to the third embodiment includes a condenser lens 81 on the second light emitting element 5IR. More specifically, the condenser lens 81 is provided in a region overlapping the cathode terminal 53-IR of the second light emitting element 5IR on the cathode electrode 22 and the black member 23. The condenser lens 81 is provided covering the first opening OP1 of the cathode electrode 22 and the second opening OP2 of the black member 23. The lower surface of the condenser lens 81 is in contact with the black member 23, the cathode electrode 22-IR, and the cathode terminal 53-IR at the peripheral part of the second opening OP2. The adhesive layer 85 is provided on the cathode electrode 22-IR and the black member 23 to cover the condenser lens 81.

The second light output from the second light emitting element 5IR-L for the light source passes through the condenser lens 81 and travels toward the display surface. This configuration can prevent the second light output from the second light emitting element 5IR-L for the light source from spreading and increase the intensity of the second light in the third direction Dz. As a result, the second light emitting element 5IR-L for the light source can satisfactorily output the second light to the finger Fin at a distant position in the second detection mode M2.

The display device 1B also includes a structure 82 in a region not overlapping the first light emitting element 5VL above the first light emitting element 5VL. The structure 82 is provided in a region not overlapping the second opening OP2 on the black member 23. The height of the structure 82 is equal to that of the condenser lens 81. Providing the structure 82 can reduce the difference in height between the region provided with the second light emitting element 5IR and the region of the pixel 20 provided with the first light emitting element 5VL in one pixel group Pix. With the structure 82, the display device 1B can reduce the difference in level formed by the condenser lens 81, the cathode electrode 22, and the black member 23.

The structure 82 may be made of a black member, such as resin material colored in black. In this case, the first light output in an oblique direction in the first light output from the first light emitting element 5VL is absorbed by the structure 82. Consequently, the display device 1B can prevent color mixture in light between the pixels 20 and prevent deterioration of the quality of a display image.

The structure 82 simply needs to reduce the difference in level formed by the condenser lens 81, and the shape in planar view, the number, and the position of the structure 82 are not particularly restricted. A plurality of structures 82 may be disposed corresponding to each of the pixels 20, or a wall-like structure 82 may be disposed surrounding the pixel 20.

Fourth Embodiment

Figure 14:
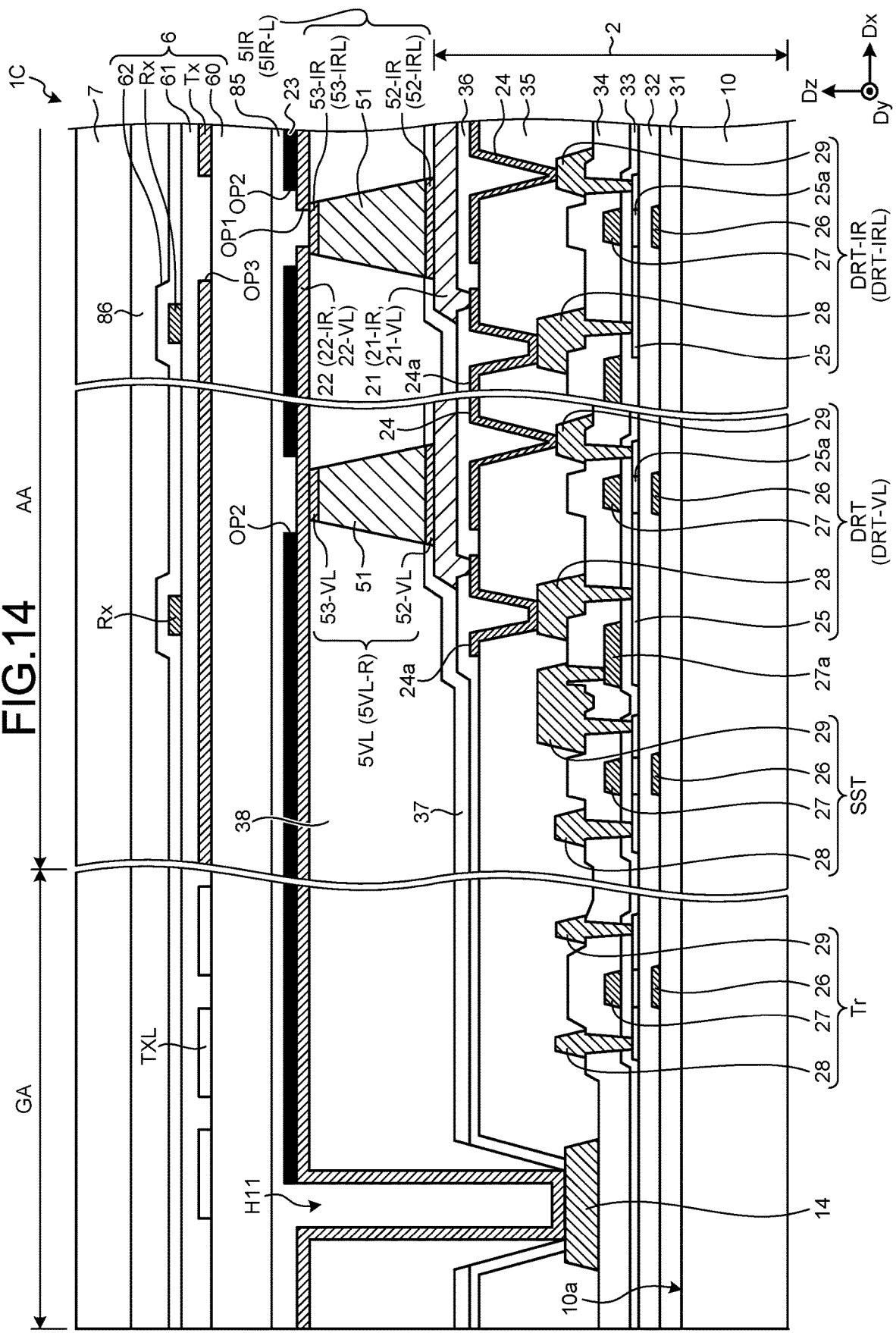
FIG. 14 is a sectional view of the display device according to a fourth embodiment.

FIG. 14 is a sectional view of the display device according to a fourth embodiment. As illustrated in FIG. 14, a display device 1C according to the fourth embodiment further includes a second detection device 6. The second detection device 6 adheres to the cathode electrode 22 and the black member 23 with the adhesive layer 85 interposed therebetween. The circularly polarizing plate 7 adheres to the second detection device 6 with an adhesive layer 86 interposed therebetween. In other words, the second detection device 6 is provided on the first light emitting elements 5VL and the second light emitting elements 5IR. The array substrate 2, the first light emitting elements 5VL and the second light emitting elements 5IR, the second detection device 6, and the circularly polarizing plate 7 are layered in order in the third direction Dz.

The second detection device 6 is a capacitive touch panel including a plurality of electrodes, for example. Alternatively, the second detection device 6 may be a film with a touch sensor, for example. The second detection device 6 includes a sensor substrate 60, a plurality of electrodes (drive electrodes Tx and detection electrodes Rx), and insulating films 61 and 62. The sensor substrate 60, the drive electrodes Tx, the insulating film 61, the detection electrodes Rx, and the insulating film 62 are layered in order in the third direction Dz.

The sensor substrate 60 is a translucent substrate that allows visible light to pass therethrough and is a glass substrate, for example. Alternatively, the sensor substrate 60 may be a translucent resin substrate or film made of resin, such as polyimide. The second detection device 6 is a translucent sensor.

The drive electrodes Tx are made of a translucent electric conductor, such as ITO, and are disposed in the display region AA. The drive electrodes Tx are coupled to a terminal of the display device 1C via wiring TXL provided in the peripheral region GA. The drive electrodes Tx are supplied with second drive signals via the terminal.

The detection electrodes Rx are made of metal thin wires, for example. The detection electrodes Rx intersect the drive electrodes Tx in planar view. The detection electrodes Rx are coupled to the terminal of the display device 1C via another wiring disposed in a layer different from that of the wiring TXL. The drive electrodes Tx and the detection electrodes Rx may be made of a translucent electric conductor, such as ITO, or metal thin wires. The drive electrodes Tx and the detection electrodes Rx may contain a black electric conductor. In this case, the drive electrodes Tx and the detection electrodes Rx can prevent reflection of external light.

The detection electrodes Rx of the second detection device 6 output second detection signals that change with proximity or contact of an external object, such as the finger Fin, based on the second drive signals supplied to the drive electrodes Tx. The second detection device 6 does not necessarily perform mutual capacitance touch detection. The second detection device 6 may perform self-capacitance touch detection. In this case, the second detection device 6 includes detection electrodes Sx instead of the drive electrodes Tx or the detection electrodes Rx. The detection electrodes Sx are supplied with the second drive signals and output the second detection signals. In other words, the detection electrodes Sx function as both the drive electrodes Tx and the detection electrodes Rx. The detection electrodes Sx are disposed in a matrix (row-column configuration), for example, and are made of a translucent electric conductor or metal material.

The detection electrodes Rx and the drive electrodes Tx are provided at positions not overlapping the second light emitting element 5IR. The second light emitting elements 5IR are each provided at a position overlapping a third opening OP3 formed in the drive electrodes Tx. This configuration can prevent reduction in intensity of the second light in the infrared light region output from the second light emitting elements 5IR compared with a case where the detection electrodes Rx and the drive electrodes Tx are provided on the second light emitting elements 5IR. In addition, this configuration can prevent the second light in the infrared light region output from the second light emitting elements 5IR from being reflected by the detection electrodes Rx and returning to the array substrate 2.

The detection electrodes Rx and the drive electrodes Tx are preferably provided at positions not overlapping the first light emitting elements 5VL. This configuration can prevent reduction in intensity of the first light in the visible light region output from the first light emitting elements 5VL and reflection of the first light by the detection electrodes Rx. Consequently, the display device 1C can prevent deterioration of the quality of a display image.

Fifth Embodiment

Figure 15:
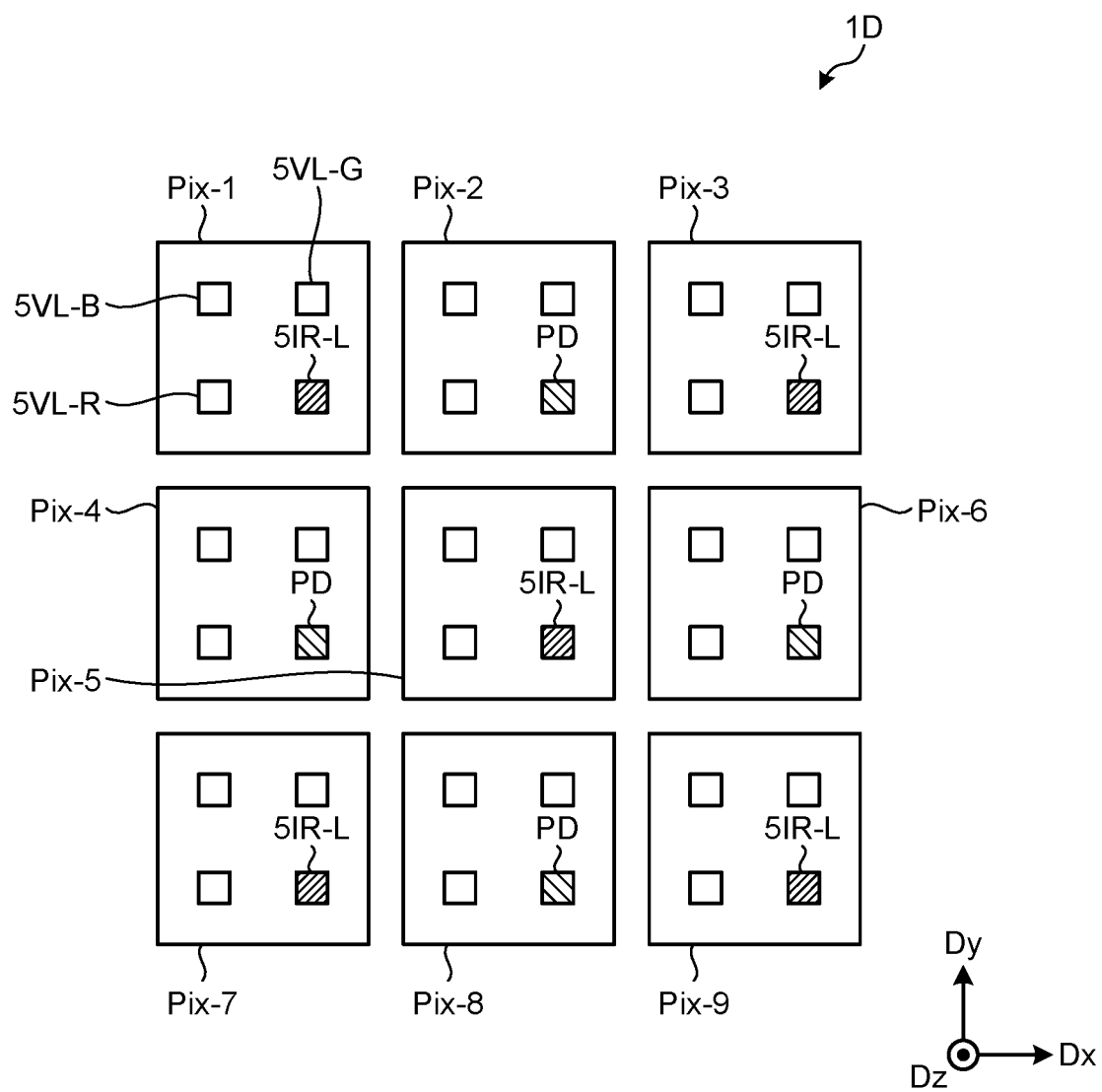
FIG. 15 is a plan view of a plurality of pixel groups in the display device according to a fifth embodiment.

FIG. 15 is a plan view of a plurality of pixel groups in the display device according to a fifth embodiment. As illustrated in FIG. 15, a display device 1D according to the fifth embodiment includes a plurality of photoelectric conversion elements PD. The photoelectric conversion elements PD each output signals based on the second light in the infrared light region incident thereon. The photoelectric conversion elements PD are Si photodiodes or CMOS image sensors, for example. The photoelectric conversion elements PD are driven by a circuit similar to the pixel circuit PIC-IRS illustrated in FIG. 6, for example, and output signals based on the second light to the detection circuit 56.

All the second light emitting elements 5IR according to the present embodiment are driven in reverse bias and operate as the second light emitting elements 5IR-L for the light source. The pixel groups Pix-1, Pix-3, Pix-5, Pix-7, and Pix-9 out of the pixel groups Pix each include the second light emitting element 5IR. The pixel groups Pix-2, Pix-4, Pix-6, and Pix-8 out of the pixel groups Pix each include the photoelectric conversion element PD. In other words, the second light emitting elements 5IR and the photoelectric conversion elements PD are alternately arrayed in the first direction Dx and the second direction Dy.

The present embodiment includes the second light emitting elements 5IR and the photoelectric conversion elements PD besides the first light emitting elements 5VL. Consequently, the display device 1D can prevent deterioration of the quality of a display image by the first light emitting elements 5VL and satisfactorily detect biological information and perform hover detection by the second light emitting elements 5IR and the photoelectric conversion elements PD.

The positions of the second light emitting elements 5IR and the photoelectric conversion elements PD are not limited to those illustrated in FIG. 15. A plurality of photoelectric conversion elements PD may be provided corresponding to one second light emitting element 5IR. Alternatively, a plurality of second light emitting elements 5IR may be provided corresponding to one photoelectric conversion element PD.

The photoelectric conversion elements PD are not necessarily provided on the single array substrate 2 provided with the second light emitting elements 5IR. The photoelectric conversion elements PD may be provided on another substrate different from the array substrate 2 and be disposed in a layer different from that of the second light emitting elements 5IR. The photoelectric conversion elements PD, for example, are provided under the substrate 10 and receive the second light reflected by the finger Fin and having passed through the display device 1D. The photoelectric conversion elements PD do not necessarily have the sensitivity to light in the infrared light region alone and may also have the sensitivity to light in the visible light region.

The parts that have been described as the anode terminal 52 and the cathode terminal 53 above are not limited to those in the present specification and may be exchanged depending on the coupling direction of the light emitting element 5 and the application direction of the voltage. While one electrode of the light emitting element 5 is disposed at a lower part, and the other electrode is disposed at an upper part in FIGS. 7, 13 and 14, both the electrodes may be disposed at a lower part, that is, on the side facing the array substrate 2. In other words, the display device 1 does not necessarily have a face-up structure in which the upper part of the light emitting element 5 is coupled to the cathode electrode 22. The display device 1 may have what is called a face-down structure in which the lower part of the light emitting element 5 is coupled to the anode electrode 21 and the cathode electrode 22.

While exemplary embodiments according to the present disclosure have been described, the embodiments are not intended to limit the disclosure. The contents disclosed in the embodiments are given by way of example only, and various changes may be made without departing from the spirit of the present disclosure. Appropriate changes made without departing from the spirit of the present disclosure naturally fall within the scope of the disclosure. At least one of various omissions, substitutions, and changes of the components may be made without departing from the spirit of the embodiments above and the modification thereof.

What is claimed is:

1. A display device comprising:
    a substrate;
    a plurality of pixels provided to the substrate;
    a plurality of first inorganic light emitting elements and a plurality of second inorganic light emitting elements provided to the pixels;
    an element insulating film provided between the first inorganic light emitting elements and the second inorganic light emitting elements and covering at least a side surface of the first inorganic light emitting elements and the second inorganic light emitting elements; and
    a cathode electrode provided covering the first inorganic light emitting elements, the second inorganic light emitting elements, and the element insulating film and coupled to the first inorganic light emitting elements and the second inorganic light emitting elements,
    wherein
    the first inorganic light emitting elements are configured to output first light in a visible light region,
    the second inorganic light emitting elements are configured to output second light in an infrared light region,
    the second inorganic light emitting elements include:
        a second light emitting element for a light source outputting the second light by being driven in forward bias; and
        a second light emitting element for detection outputting signals based on the second light incident thereon by being driven in reverse bias,
    the cathode electrode has a first opening in a region overlapping the second inorganic light emitting elements,
    a black member is provided on the cathode electrode,
    the black member has a second opening in a region overlapping the first opening, and
    the area of the second opening is larger than the area of the first opening in planar view seen from a direction perpendicular to the substrate.

2. The display device according to claim 1, wherein
    the first inorganic light emitting elements and the second inorganic light emitting elements each comprise an anode terminal and a cathode terminal,
    the anode terminal of a second inorganic light emitting element for a light source is supplied with a first potential, the second inorganic light emitting element for the light source being configured to output the second light out of the second inorganic light emitting elements, and
    the cathode terminal of the second inorganic light emitting element for the light source is supplied with a second potential lower than the first potential.

3. The display device according to claim 2, wherein
    the anode terminal of a second inorganic light emitting element for detection is supplied with the second potential, the second inorganic light emitting element for detection being configured to output a signal based on the second light incident on the second inorganic light emitting element for detection out of the second inorganic light emitting elements, and
    the cathode terminal of the second inorganic light emitting element for detection is supplied with the first potential.

4. The display device according to claim 1, wherein
    the first inorganic light emitting elements and the second inorganic light emitting elements each comprise an anode terminal and a cathode terminal, and
    the display device further comprises:
        a first power supply line configured to supply a first potential to the second inorganic light emitting element;

a second power supply line configured to supply a
second potential lower than the first potential to the
second inorganic light emitting element;
a first switch element configured to switch between
coupling destinations of the anode terminal of the
second inorganic light emitting element to the first
power supply line and to the second power supply
line; and
a second switch element configured to switch between
coupling destinations of the cathode terminal of the
second inorganic light emitting element to the first
power supply line and to the second power supply
line.

5. The display device according to claim 4, wherein
by operating the first switch element and the second
switch element,
a single second inorganic light emitting element is
switched between being a second inorganic light emitting element for a light source and being a second
inorganic light emitting element for detection in a
time-division manner, the second inorganic light emitting element for the light source being configured to
output the second light, the second inorganic light
emitting element for detection being configured to
output a signal based on the second light incident on the
second inorganic light emitting element for detection.

6. The display device according to claim 5, wherein
the display device has a first detection mode and a second
detection mode, the first detection mode and the second
detection mode being different in number of the second
inorganic light emitting elements for the light source
and number of the second inorganic light emitting
elements for detection,
the second inorganic light emitting elements for the light
source and the second inorganic light emitting elements
for detection are alternately arrayed in the first detection mode, and
the ratio of the number of the second inorganic light
emitting elements for detection to the number of the
second inorganic light emitting element for the light
source is larger in the second detection mode than in the
first detection mode.

7. The display device according to claim 3, further comprising a detection circuit configured to detect a signal
output based on light incident on the second inorganic light
emitting element for detection.

8. The display device according to claim 1, wherein a
condenser lens is provided on the second inorganic light
emitting element.

9. The display device according to claim 8, wherein
the condenser lens is provided on the cathode electrode
coupled to the first inorganic light emitting elements
and the second inorganic light emitting elements, and
a structure having a height equal to a height of the
condenser lens is provided in a region not overlapping
the first inorganic light emitting element above the first
inorganic light emitting element.

10. The display device according to claim 1, further
comprising:
a capacitive detection device provided on the first inorganic light emitting elements and the second inorganic
light emitting elements and including a plurality of
electrodes, wherein
the electrodes are provided in a region not overlapping the
second inorganic light emitting element.

11. The display device according to claim 1, further
comprising a plurality of photoelectric conversion elements
configured to output a signal based on the second light
incident on the photoelectric conversion elements.

12. The display device according to claim 1,
the pixels are arranged in a first direction and a second
direction crossing the first direction,
the pixels include:
first pixels each having the second light emitting element for the light source; and
second pixels each having the second light emitting
element for detection, and
the first pixels and the second pixels are arranged alternately in the first direction and in the second direction.

13. A display device comprising:
a substrate;
a plurality of pixels provided to the substrate; and
a plurality of first inorganic light emitting elements and a
plurality of second inorganic light emitting elements
provided to the pixels, wherein
the first inorganic light emitting elements are configured
to output first light in a visible light region,
the second inorganic light emitting elements are configured to output second light in an infrared light region,
and
the second inorganic light emitting elements include:
a second light emitting element for a light source
outputting the second light by being driven in forward bias; and
a second light emitting element for detection outputting
signals based on the second light incident thereon by
being driven in reverse bias,
the first inorganic light emitting elements and the second
inorganic light emitting elements each comprise an
anode terminal and a cathode terminal,
the display device further comprises:
a first power supply line configured to supply a first
potential to the second inorganic light emitting element;
a second power supply line configured to supply a
second potential lower than the first potential to the
second inorganic light emitting element;
a first switch element configured to switch between
coupling destinations of the anode terminal of the
second inorganic light emitting element to the first
power supply line and to the second power supply
line; and
a second switch element configured to switch between
coupling destinations of the cathode terminal of the
second inorganic light emitting element to the first
power supply line and to the second power supply
line,
wherein
by operating the first switch element and the second
switch element,
a single second inorganic light emitting element is
switched between being a second inorganic light emitting element for a light source and being a second
inorganic light emitting element for detection in a
time-division manner, the second inorganic light emitting element for the light source being configured to
output the second light, the second inorganic light
emitting element for detection being configured to
output a signal based on the second light incident on the
second inorganic light emitting element for detection,
the display device has a first detection mode and a second
detection mode, the first detection mode and the second
detection mode being different in number of the second inorganic light emitting elements for the light source and number of the second inorganic light emitting elements for detection, the second inorganic light emitting elements for the light source and the second inorganic light emitting elements for detection are alternately arrayed in the first detection mode, and the ratio of the number of the second inorganic light emitting elements for detection to the number of the second inorganic light emitting element for the light source is larger in the second detection mode than in the first detection mode.

* * * * *